(12) United States Patent
Monski, Jr. et al.

(10) Patent No.: US 7,084,629 B2
(45) Date of Patent: Aug. 1, 2006

(54) PARALLEL IMAGING COMPATIBLE BIRDCAGE RESONATOR

(75) Inventors: William J. Monski, Jr., Sewickley, PA (US); Fahad Alradady, Glenshaw, PA (US); George J. Misic, Allison Park, PA (US)

(73) Assignee: Medrad, Inc., Indianola, PA (US)

(*) Notice: Subject to any disclaimer, the term of this patent is extended or adjusted under 35 U.S.C. 154(b) by 0 days.

(21) Appl. No.: 10/723,428

(22) Filed: Nov. 27, 2003

(65) Prior Publication Data

US 2005/0099179 A1 May 12, 2005

Related U.S. Application Data

(60) Provisional application No. 60/429,855, filed on Nov. 27, 2002.

(51) Int. Cl.
*G01V 3/00* (2006.01)

(52) U.S. Cl. .................. 324/318; 324/322

(58) Field of Classification Search ........ 324/318–322, 324/316, 314, 312; 600/410, 422
See application file for complete search history.

(56) References Cited

U.S. PATENT DOCUMENTS

| | | | |
|---|---|---|---|
| 4,634,980 A | 1/1987 | Misic et al. | |
| 4,684,895 A | 8/1987 | Misic et al. | |
| 4,692,705 A | 9/1987 | Hayes | |
| 4,731,584 A | 3/1988 | Misic et al. | |
| 4,740,751 A | 4/1988 | Misic et al. | |
| 4,764,726 A | 8/1988 | Misic et al. | |
| 4,793,356 A | 12/1988 | Misic et al. | |
| 4,797,617 A | 1/1989 | Misic et al. | |
| 4,825,162 A | 4/1989 | Roemer et al. | |
| 4,839,594 A | 6/1989 | Misic et al. | |
| 4,841,248 A | 6/1989 | Mehdizadeh | |
| 4,879,516 A | 11/1989 | Mehdizadeh et al. | |
| 4,881,034 A | 11/1989 | Kaufman et al. | |
| 4,920,318 A | 4/1990 | Misic et al. | |
| 4,975,644 A | 12/1990 | Fox | |
| 5,136,244 A | 8/1992 | Jones et al. | |
| 5,196,796 A | 3/1993 | Misic et al. | |
| 5,209,233 A | 5/1993 | Holland et al. | |
| 5,256,971 A | 10/1993 | Boskamp | |
| 5,258,717 A | 11/1993 | Misic et al. | |
| 5,315,251 A | 5/1994 | Derby | |
| 5,517,120 A | 5/1996 | Misic et al. | |

(Continued)

OTHER PUBLICATIONS

Lin, et al., Magnetic Resonance in Medicine, "A Novel Multi-Segment Surface Coil for Neuro-Functional Magnetic Resonance Imaging," vol. 39, pp. 164-168 (1998).

(Continued)

*Primary Examiner*—Diego Gutierrez
*Assistant Examiner*—Tiffany A. Fetzner
(74) *Attorney, Agent, or Firm*—James R. Stevenson

(57) ABSTRACT

A birdcage coil for use with a magnetic resonance (MR) system comprises a first ring at one thereof, a second ring at the other end thereof, and a plurality of rods electrically interconnecting the first and second rings. The first ring is electrically conductive and has a first diameter. The second ring is electrically conductive and has a second diameter. The rods and first and second rings are configured to form about the birdcage coil a plurality of partially-overlapped primary resonant substructures. Each primary resonant substructure includes two of the rods and the corresponding sections of the first and second rings interconnecting them.

75 Claims, 25 Drawing Sheets

U.S. PATENT DOCUMENTS

| | | | |
|---|---|---|---|
| 5,521,506 A | 5/1996 | Misic et al. | |
| 5,602,479 A * | 2/1997 | Srinivasan et al. | 324/318 |
| 5,610,520 A | 3/1997 | Misic et al. | |
| 5,664,568 A * | 9/1997 | Srinivasan et al. | 600/422 |
| 5,998,999 A | 12/1999 | Richard et al. | |
| 6,040,697 A | 3/2000 | Misic | |
| 6,051,974 A | 4/2000 | Reisker et al. | |
| 6,060,883 A | 5/2000 | Knuttel | |
| 6,100,691 A | 8/2000 | Yeung | |
| 6,177,797 B1 | 1/2001 | Srinivasan | |
| 6,223,065 B1 | 4/2001 | Misic et al. | |
| 6,344,745 B1 * | 2/2002 | Reisker et al. | 324/318 |
| 6,356,081 B1 | 3/2002 | Misic | |
| 6,396,273 B1 | 5/2002 | Misic | |
| 6,426,624 B1 * | 7/2002 | Snelten | 324/318 |
| 6,549,799 B1 * | 4/2003 | Bock et al. | 600/422 |
| 6,714,013 B1 * | 3/2004 | Misic | 324/318 |
| 6,745,064 B1 * | 6/2004 | Fuderer et al. | 600/410 |
| 6,831,460 B1 * | 12/2004 | Reisker et al. | 324/318 |
| 6,850,064 B1 * | 2/2005 | Srinivasan | 324/318 |
| 2002/0156362 A1 * | 10/2002 | Bock et al. | 600/410 |
| 2003/0071622 A1 * | 4/2003 | Reisker et al. | 324/318 |
| 2005/0099179 A1 * | 5/2005 | Monski et al. | 324/318 |

OTHER PUBLICATIONS

Meyer et al., Journal of Magnetic Resonance, Series B, "A 3×3 Mesh Two-Dimensional Ladder Network Resonator of MRI of the Human Head," vol. 107, p. 19-24 (1995).

Roemer et al., Magnetic Resonance in Medicine, "The NMR Phased Array," vol. 16, pp. 192-225 (1990).

Adriany, G. et al., "A Transmit/Receive Quadrature Birdcage Array Coil for 4 Tesla," Proceedings of the ISMRM, 5th Scientific Meeting and Exh., v. 1, p. 177 (Apr. 12-18, 1997).

Adriany G. et al., "A Transmit/Receive Quadrature Birdcage Array for 4 Tesla," Presentation to the ISMRM, 5th Scientific Meeting and Exhibition., Vancouver (Apr. 12-18, 1997).

Brochure: "High Resolution Head Coil for GE MRI Systems," MRI Devices Corporation, Rev. 2, Jan. 2002.

Brochure: "Neurovascular High Resolution Head Coil 1.5 T & 3.0T," MRI Devices Corporation, Undated.

* cited by examiner

PARALLEL IMAGING COMPATIBLE BIRDCAGE RESONATOR

CROSS-REFERENCE TO RELATED APPLICATION(S)

This application for patent claims the benefit of U.S. Provisional Application Ser. No. 60/429,855 titled Parallel Imaging Compatible Birdcage Resonator, filed Nov. 27, 2002. This provisional application has been assigned to the assignee of the invention disclosed below, and its teachings are incorporated into this document by reference.

FIELD OF THE INVENTION

The invention generally relates to the field of magnetic resonance (MR) imaging and spectroscopy systems and to the various types of local coils used with such systems. More particularly, the invention pertains to local coils, such as those used to image the human head, which are designed to be used with 8-channel MR systems capable of acquiring images using parallel imaging techniques.

BRIEF DESCRIPTION OF RELATED ART

The following information is provided to assist the reader to understand the environment in which the invention disclosed herein will typically be used.

Magnetic resonance imaging (MRI) is a noninvasive method of producing high quality images of the interior of the human body. It allows medical personnel to see inside the body (e.g., organs, muscles, nerves, bones, and other structures) without surgery or the use of potentially harmful ionizing radiation such as X-rays. The images are of such high resolution that disease and other forms of pathology can often be visually distinguished from healthy tissue. Magnetic resonance (MR) systems and techniques have also been developed for performing spectroscopic analyses by which the chemical content of tissue or other material can be ascertained.

MR imaging and spectroscopic procedures are performed in what is known as an MR suite. As shown in FIG. 1A, an MR suite typically has three rooms: a scanner room 1, a control room 2, and an equipment room 3. The scanner room 1 houses the MR scanner 10 into which a patient is moved via a slideable table 11 to undergo a scanning procedure, and the control room 2 contains a computer console 20 from which the operator controls the overall operation of the MR system. In addition to a door 4, a window 5 is typically set in the wall separating the scanner and control rooms to allow the operator to observe the patient during such procedures. The equipment room 3 contains the various subsystems necessary to operate the MR system. The equipment includes a power gradient controller 31, a radio frequency (RF) assembly 32, a spectrometer 33, and a cooling subsystem 34 with which to avoid the build up of heat which, if left unaddressed, could otherwise interfere with the overall performance of the MR system. These subsystems are typically housed in separate cabinets, and are supplied electricity through a power distribution panel 12 as are the scanner 10 and the slideable patient table 11. The scanner room 1 is shielded to prevent the entry and exit of electromagnetic waves. Specifically, the materials and design of its ceiling, floor, walls, door, and window effectively form a barrier or shield 6 that prevents the electromagnetic signals generated during a scanning procedure (e.g., the RF energy) from leaking out of scanner room 1. Likewise, shield 6 is designed to prevent external electromagnetic noise from leaking into the scanner room 1.

An MR system obtains such detailed images and spectroscopic results by taking advantage of a basic property of the hydrogen atom, which is found in abundance in all cells within the body. Within the body's cells, the nuclei of hydrogen atoms naturally spin like a top, or precess, randomly in every direction. When subject to a strong magnetic field, however, the spin-axes of the hydrogen nuclei align themselves in the direction of that field. This is because the nucleus of the hydrogen atom has what is referred to as a large magnetic moment, which is basically an inherent tendency to line up with the direction of the magnetic field to which it is exposed. During an MR scan, the entire body or even just one region thereof is exposed to such a magnetic field. This causes the hydrogen nuclei of the exposed region (s) to line up—and collectively form an average vector of magnetization—in the direction of that magnetic field.

As shown in FIGS. 1B and 1C, the scanner 10 is comprised of a main magnet 101, three gradient coils 103$a$–$c$, and, usually, an RF antenna 104 (often referred to as the whole body coil). Superconducting in nature, the main magnet 101 is typically cylindrical in shape. Within its cylindrical bore, the main magnet 101 generates a strong magnetic field, often referred to as the $B_0$ or main magnetic field, which is both uniform and static (non-varying). For a scanning procedure to be performed, the patient must be moved into this cylindrical bore, typically while supine on table 11, as best shown in FIGS. 1B and 1C. The main magnetic field is oriented along the longitudinal axis of the bore, referred to as the z direction, which compels the magnetization vectors of the hydrogen nuclei in the body to align themselves in that direction. In this alignment, the hydrogen nuclei are prepared to receive RF energy of the appropriate frequency from RF coil 104. This frequency is known as the Larmor frequency and is governed by the equation $\omega = \Upsilon B_0$, where $\omega$ is the Larmor frequency (at which the hydrogen atoms precess), $\Upsilon$ is the gyromagnetic constant, and $B_0$ is the strength of the main magnetic field.

The RF coil 104 is generally used both to transmit pulses of RF energy and to receive the resulting magnetic resonance (MR) signals induced thereby in the hydrogen nuclei. Specifically, during its transmit cycle, the coil 104 broadcasts RF energy into the cylindrical bore. This RF energy creates a radio frequency magnetic field, also known as the RF $B_1$ field, whose magnetic field lines point in a direction perpendicular to the magnetization vectors of the hydrogen nuclei. The RF pulse (or $B_1$ field) causes the spin-axes of the hydrogen nuclei to tilt with respect to the main ($B_0$) magnetic field, thus causing the net magnetization vectors to deviate from the z direction by a certain angle. The RF pulse, however, will affect only those hydrogen nuclei that are precessing about their axes at the frequency of the RF pulse. In other words, only the nuclei that "resonate" at that frequency will be affected, and such resonance is achieved in conjunction with the operation of the gradient coils 103$a$–$c$.

Each of the three gradient coils is used to vary the main ($B_0$) magnetic field linearly along only one of the three spatial directions (x,y,z) within the cylindrical bore. Positioned inside the main magnet as shown in FIG. 1C, the gradient coils 103$a$–$c$ are able to alter the main magnetic field on a very local level when they are turned on and off very rapidly in a specific manner. Thus, in conjunction with the main magnet 101, the gradient coils 103$a$–$c$ can be operated according to various imaging techniques so that the hydrogen nuclei—at any given point or in any given strip, slice or unit of volume—will be able to achieve resonance when an RF pulse of the appropriate frequency is applied. In response to the RF pulse, the precessing hydrogen nuclei in the selected region absorb the RF energy being transmitted from RF coil 104, thus forcing the magnetization vectors thereof to tilt away from the direction of the main ($B_0$) magnetic field. When the RF coil 104 is turned off, the hydrogen nuclei begin to release the RF energy they just absorbed in the form of magnetic resonance (MR) signals, as explained further below.

One well known technique that can be used to obtain images is referred to as the spin echo imaging technique. Operating according to this technique, the MR system first activates one gradient coil 103*a* to set up a magnetic field gradient along the z-axis. This is called the "slice select gradient," and it is set up when the RF pulse is applied and is shut off when the RF pulse is turned off. It allows resonance to occur only within those hydrogen nuclei located within a slice of the region being imaged. No resonance will occur in any tissue located on either side of the plane of interest. Immediately after the RF pulse ceases, all of the nuclei in the activated slice are "in phase," i.e., their magnetization vectors all point in the same direction. Left to their own devices, the net magnetization vectors of all the hydrogen nuclei in the slice would relax, thus realigning with the z direction. Instead, however, the second gradient coil 103*b* is briefly activated to create a magnetic field gradient along the y-axis. This is called the "phase encoding gradient." It causes the magnetization vectors of the nuclei within the slice to point, as one moves between the weakest and strongest ends of this gradient, in increasingly different directions. Next, after the RF pulse, slice select gradient and phase encoding gradient have been turned off, the third gradient coil 103*c* is briefly activated to create a gradient along the x-axis. This is called the "frequency encoding gradient" or "read out gradient," as it is only applied when the MR signal is ultimately measured. It causes the relaxing magnetization vectors to be differentially re-excited, so that the nuclei near the low end of that gradient begin to precess at a faster rate, and those at the high end pick up even more speed. When these nuclei relax again, the fastest ones (those which were at the high end of the gradient) will emit the highest frequency of radio waves and the slowest ones emit the lowest frequencies.

The gradient coils 103*a–c* therefore allow these radio waves to be spatially encoded, so that each portion of the region being imaged is uniquely defined by the frequency and phase of its resonance signal. In particular, as the hydrogen nuclei relax, each becomes a miniature radio transmitter, giving out a characteristic pulse that changes over time, depending on the local microenvironment in which it resides. For example, hydrogen nuclei in fats have a different microenvironment than do those in water, and thus emit different pulses. Due to these differences, in conjunction with the different water-to-fat ratios of different tissues, different tissues emit radio signals of different frequencies. During its receive cycle, RF coil 104 detects these miniature radio emissions, which are often collectively referred to as the MR signal(s). From the RF coil 104, these unique resonance signals are conveyed to the receivers of the MR system where they are converted into mathematical data. The entire procedure must be repeated multiple times to form an image with a good signal-to-noise ratio (SNR). Using multidimensional Fourier transformations, the MR system then converts the mathematical data into a two- or even a three-dimensional image of the body, or region thereof, that was scanned.

When more detailed images of a specific part of the body are needed, a local coil is often used in addition to, or instead of, the whole body coil 104. A local coil can take the form of a volume coil or a surface coil. A volume coil is used to surround or enclose a volume (e.g., a head, an arm, a wrist, a knee or other region) to be imaged. Some volume coils (e.g., for imaging the head and/or extremities) are often referred to as birdcage coils due to their shape. A surface coil, however, is merely fitted or otherwise placed against a surface (e.g., a shoulder, a breast, etc.) of the patient so that the underlying region can be imaged. In addition, a local coil can be designed to operate either as a receive-only coil or a transmit/receive (T/R) coil. A receive-only coil is only capable of detecting the MR signals produced by the body (in response to the RF $B_1$ magnetic field generated by the body coil 104 during a scanning procedure). A T/R coil, however, is capable of both receiving the MR signals as well as transmitting the RF pulses that produce the RF $B_1$ magnetic field, which is the prerequisite for inducing resonance in the tissues of the region of interest.

It is well known in the field of MRI to use a single local coil, whether surface or volume, to detect the MR signals. According to the single coil approach, a relatively large local coil is used to cover or enclose the entire region of interest. Early receiving coils were just linear coils, meaning that they could detect only one of the two (i.e., vertical and horizontal) quadrature components of the MR signals produced by the region of interest. Subsequent receiving coils, however, employed quadrature mode detection, meaning that they could intercept both the vertical and horizontal components. Compared to linear receiving coils, quadrature receiving coils enabled MRI systems to provide images for which the SNR was much improved, theoretically by as much as 41%. Even with the improvement brought with quadrature mode detection, the single coil approach still provided images whose quality invited improvement. The disadvantage of the single coil approach is attributable to just one coil structure being used to acquire the MR signals over the entire region of interest.

With the advent of MR systems equipped with multiple receivers, phased array coils were developed to overcome the shortcomings with the single coil approach. Instead of one large local coil, the phased array approach uses a plurality of smaller local coils (also referred to as "coil elements"), with each such coil element covering or enclosing only a portion of the region of interest and its output typically routed to one receiver or channel of the MR system. In a phased array coil system having two such coil elements, for example, each element would cover or enclose approximately half of the region of interest, with the two coil elements being partially overlapped for purposes of magnetic isolation. The two coil elements would acquire the MR signals from their respective portions simultaneously, and they would not interact adversely due to the overlap. Because each coil element covers only half of the region of interest, each such coil element is able to receive the MR signals at a higher SNR ratio for that portion of the region of the interest within its coverage area. The smaller coil elements of the phased array thus collectively provide the MR system with the signal data necessary to generate an image of the entire region of interest that is higher in resolution than what can be obtained from a single large local coil.

One example of a phased array coil is the neurovascular array (NVA). An NVA is typically comprised of a series of local coils that are used to image the head, neck and cervical spine regions of the body. A particular NVA and the head coil used therewith are disclosed in U.S. Pat. No. 6,356,081 to Misic and U.S. Pat. No. 6,344,745 to Reisker et al., respectively, which are incorporated herein by reference. Such head coils, which are often called birdcages due to their distinct shape, typically have a pair of circular end rings which are bridged by a plurality of equispaced straight rods. The birdcage coil disclosed in the '745 patent has end rings of different size, however, and the rods that extend therebetween are tapered accordingly. This improves the homogeneity of the magnetic flux density throughout the head coil, particularly in its XZ and YZ imaging planes.

As noted above, the spatial information in magnetic resonance images has been traditionally encoded through the application of rapidly-switched magnetic field gradients and RF pulses. The speed of a given MR imaging technique is determined by how quickly this spatial encoding may be performed. Most of the fast imaging sequences now in use (EPI, FLASH, TSE, spiral, or BURST, for example) achieve their high speeds by optimizing the switching rates and patterns of gradients and pulses. One common feature of all these techniques, however, is that they all acquire data in a sequential fashion. Regardless of the particular sequence the acquisition follows, the MR signal is always acquired one point and one line at a time, with each separate line of data requiring a separate application of field gradients and/or RF pulses. Thus, imaging speed is generally limited by the maximum switching rates compatible with scanner technology and patient safety.

SMASH, which stands for "SiMultaneous Acquisition of Spatial Harmonics," is a partially parallel imaging technique, which exploits the geometry of an RF coil array to encode multiple lines of MR image data simultaneously, thereby multiplying the speed of existing sequential imaging sequences by an integer factor. In experiments using commercially available coil arrays, SMASH has been used to accelerate a number of fast imaging sequences, without increasing gradient switching rates or RF power deposition.

Nearly all existing sequential rapid imaging sequences may be accelerated in this manner, and, to date, SMASH has been successfully tested with a wide range of sequence types, including TSE, RARE, HASTE, TFE, FLASH, True-FISP, EPI, and BURST. Both two-dimensional and three-dimensional acquisitions are amenable to acceleration using SMASH. Whereas the ultimate speeds of most sequential imaging techniques are limited by physical and physiologic constraints on gradient switching rate and RF power deposition, achievable SMASH imaging speeds are limited in principle only by the number and arrangement of RF array elements which may reasonably be constructed and interfaced with an MR scanner. The improvements in imaging efficiency afforded by SMASH may be put to use in a number of ways, including: (1) reduction in breath-hold times for clinical MR scans, to increase patient compliance and comfort; (2) reduction in the overall duration of longer scans, once again increasing comfort and compliance, and also increasing the throughput of clinical MR scanners and the cost-effectiveness of MR diagnosis; (3) improvements in temporal resolution (i.e., shorter image acquisition intervals), minimizing undesired effects of physiologic motion while allowing accurate tracking of time-dependent phenomena; (4) improvements in the spatial resolution which may be achieved in a given imaging time; and (5) improvements in image quality resulting from a reduction in time-dependent artifacts (due to motion, susceptibility, relaxation, etc.).

Sensitivity encoding (SENSE) is another parallel imaging technique. It can be used to reduce scan time in MRI considerably. The spatial information related to the coils of a receiver array are utilized for reducing conventional Fourier encoding. SENSE can, in principle, be applied to any imaging sequence and k-space trajectories.

ASSET (Array Spatial Sensitivity Encoding Technique) is yet another parallel imaging technique. Developed by General Electric Medical Systems (GEMS), ASSET uses the unique geometry of phased array coils to spatially encode the image faster. The ASSET technique can be used to scan faster, improve spatial resolution and/or increase coverage.

One MR system that is capable of acquiring images of a region of interest using parallel imaging techniques is the GEMS Signa® 8-channel 1.5 Tesla MR system. Due to the development of such MR systems, there is now a need to provide local coils and the associated interface circuitry to take advantage of the faster parallel imaging capabilities offered by such new MR systems.

The prior art head coils disclosed in the above-cited patents were not originally built for operation with MR systems capable of acquiring images of the head using parallel imaging techniques. The head coil disclosed in the '745 patent acquires its images by means of overlapping signal patterns, i.e., the two quadrature modes overlap and are acquired simultaneously. Because of that overlap, the head coil is not appropriate for acquiring images using parallel imaging techniques. It would therefore be quite advantageous to develop a head coil that is capable not only of providing the homogeneity of the prior art head coil disclosed in the '745 patent but also of acquiring images using parallel imaging techniques.

SUMMARY OF THE INVENTION

The objectives and advantages of the invention are attained by the various embodiments and related aspects of the invention summarized below.

In a presently preferred embodiment, the invention provides a birdcage coil for use with an MR system capable of acquiring images of a region of interest using parallel imaging techniques. The birdcage coil comprises a first ring at an inferior end thereof, a second ring at a superior end thereof, and a plurality of rods electrically interconnecting the first and second rings. The first ring is electrically conductive and has a first diameter through which the region of interest is provided access to the birdcage coil. The second ring is electrically conductive and has a second diameter smaller than the first diameter of the first ring. Each rod has a linear portion and a tapered portion, with the linear portion being connected to the first ring and the tapered portion being connected to the second ring. The tapered portions of the rods collectively provide the birdcage coil with a substantially homogeneous pattern of magnetic flux density in at least one of three orthogonal imaging planes of the birdcage coil while at least maintaining and/or improving the signal-to-noise ratio of the birdcage coil. The rods and first and second rings are configured to form about the birdcage coil a plurality of partially-overlapped primary resonant substructures. Each primary resonant substructure includes two of the rods and the corresponding sections of the first and second rings interconnecting them. The primary resonant substructures are capable of being used by the MR system for simultaneous reception of magnetic resonance signals from the region of interest.

In a related aspect, invention provides a birdcage coil for use with an MR system capable of acquiring images of a region of interest using parallel imaging techniques. The birdcage coil comprises a first ring at one thereof, a second ring at the other end thereof, and a plurality of rods electrically interconnecting the first and second rings. The first ring is electrically conductive and has a first diameter. The second ring is electrically conductive and has a second diameter different from the first diameter of the first ring. The rods and first and second rings are configured to form about the birdcage coil a plurality of partially-overlapped primary resonant substructures. Each primary resonant substructure includes two of the rods and the corresponding sections of the first and second rings interconnecting them. The primary resonant substructures are capable of being used by the MR system for simultaneous reception of magnetic resonance signals from the region of interest.

In a broader aspect, invention provides a birdcage coil for use with an MR system capable of acquiring images of a region of interest using parallel imaging techniques. The birdcage coil comprises a first ring at one thereof, a second ring at the other end thereof, and a plurality of rods electrically interconnecting the first and second rings. The first ring is electrically conductive and has a first diameter. The second ring is electrically conductive and has a second diameter. The rods and first and second rings are configured to form about the birdcage coil a plurality of partially-overlapped primary resonant substructures. Each primary resonant substructure includes two of the rods and the corresponding sections of the first and second rings interconnecting them. The primary resonant substructures are capable of being used by the MR system for simultaneous reception of magnetic resonance signals from the region of interest.

In an even broader aspect, invention provides a birdcage coil for use with an MR system. The birdcage coil comprises a first ring at one thereof, a second ring at the other end thereof, and a plurality of rods electrically interconnecting the first and second rings. The first ring is electrically conductive and has a first diameter. The second ring is electrically conductive and has a second diameter. The rods and first and second rings are configured to form about the birdcage coil a plurality of partially-overlapped primary resonant substructures. Each primary resonant substructure includes two of the rods and the corresponding sections of the first and second rings interconnecting them.

BRIEF DESCRIPTION OF THE DRAWINGS

The invention, and particularly its presently preferred and alternative embodiments and related aspects, will be better understood by reference to the detailed disclosure below and to the accompanying drawings, in which.

Figure 1A:
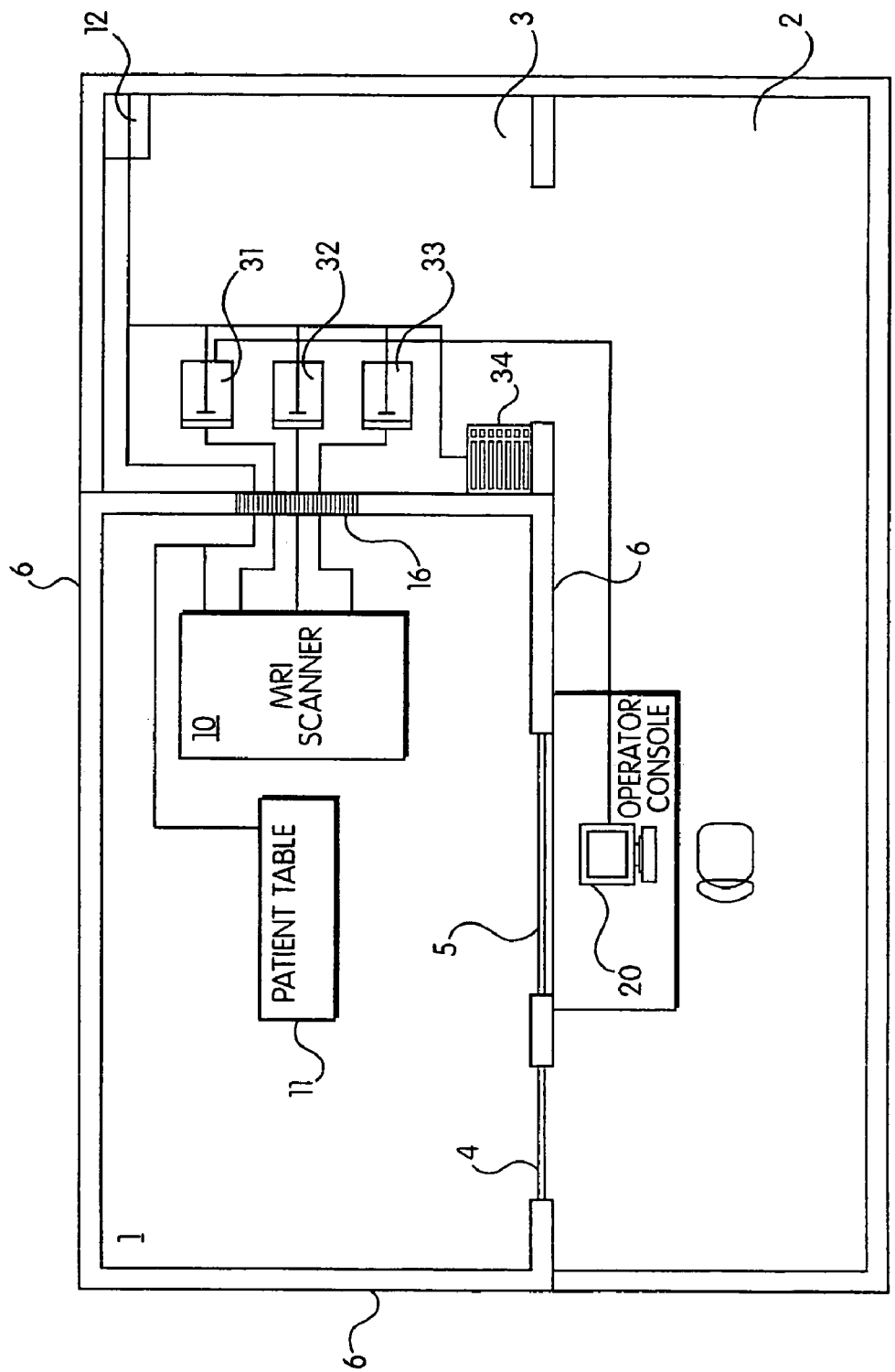
FIG. 1A illustrates the layout of an MR suite inclusive of the scanner room in which the scanner and patient table are located, the control room in which the computer console for controlling the scanner is situated, and the equipment room in which various control subsystems for the scanner are sited.
Figure 1B:
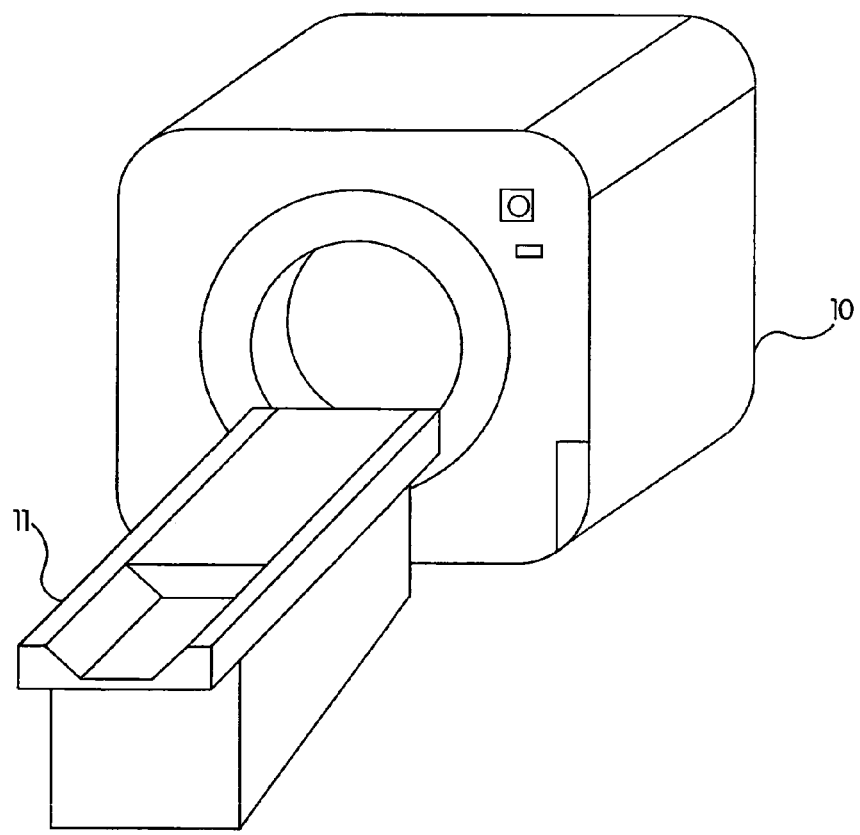
FIG. 1B shows a scanner and patient table of the type shown schematically in FIG. 1A.
Figure 1C:
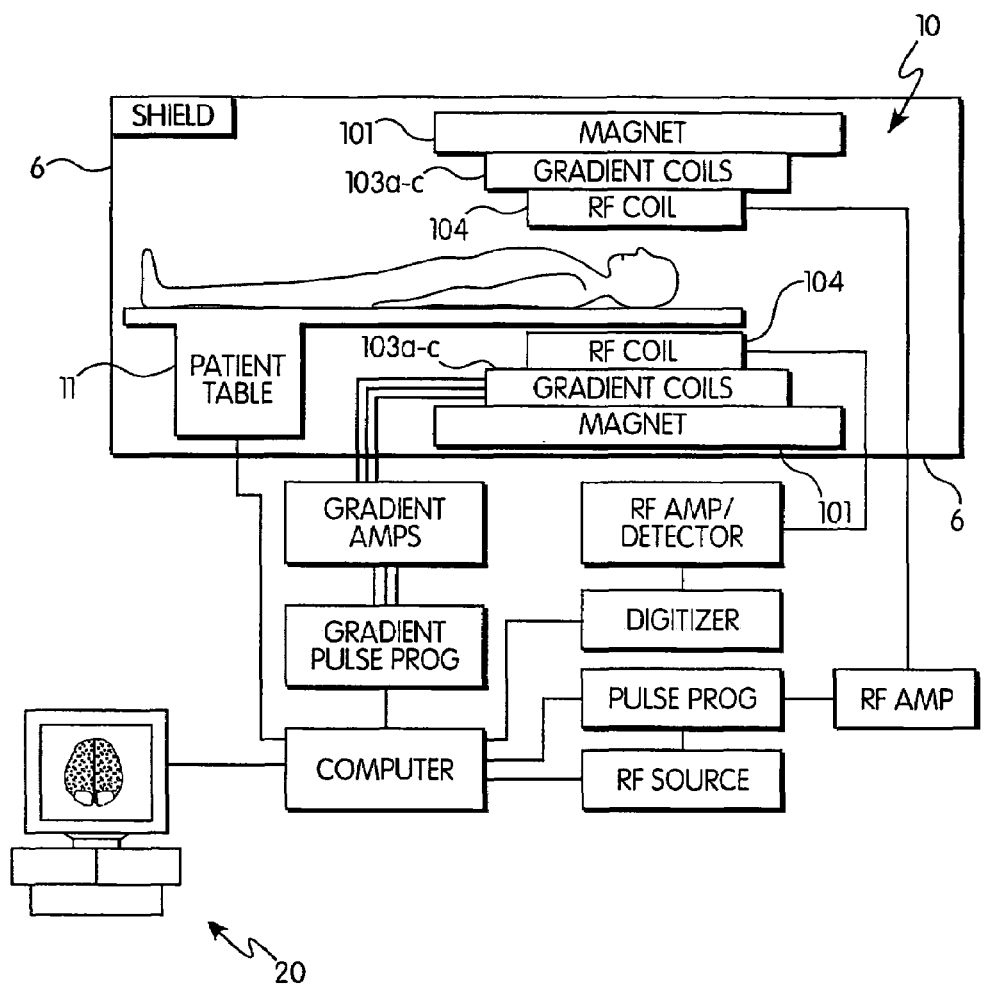
FIG. 1C is a more detailed view of the MR system shown in FIGS. 1A and 1B showing the computer console and the various subsystems located in the control and equipment rooms and a cross-section of the scanner and patient table situated in the scanner room.

DETAILED DESCRIPTION OF THE PRESENTLY PREFERRED AND ALTERNATIVE EMBODIMENTS OF THE INVENTION

The presently preferred and alternative embodiments and related aspects of the invention will now be described with reference to the accompanying drawings, in which like elements have been designated where possible by the same reference numerals.

Figure 2A:
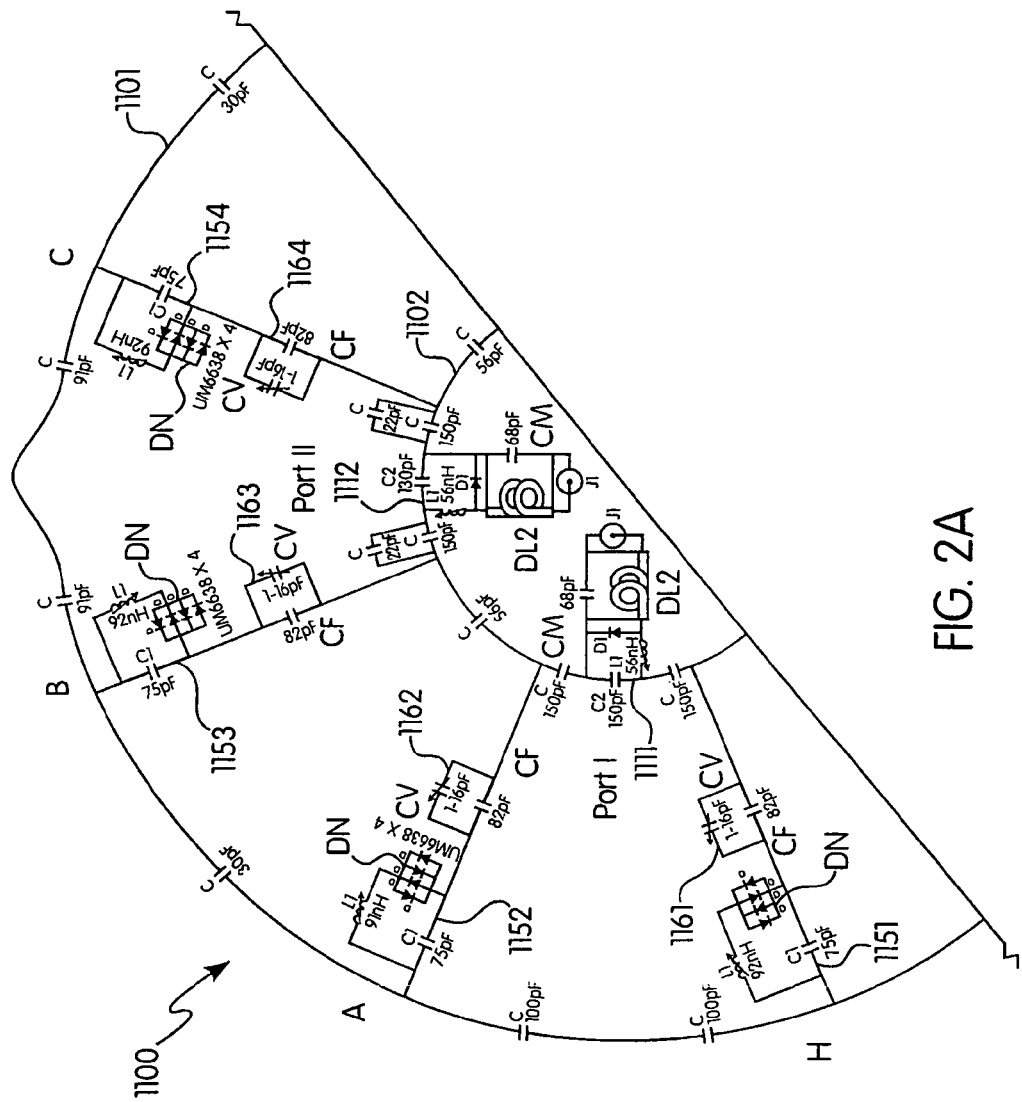
FIGS. 2A and 2B illustrate a schematic circuit diagram for a presently preferred embodiment of a receive-only tapered birdcage resonator, or Head Coil section, for a Neurovascular Array.
Figure 2B:
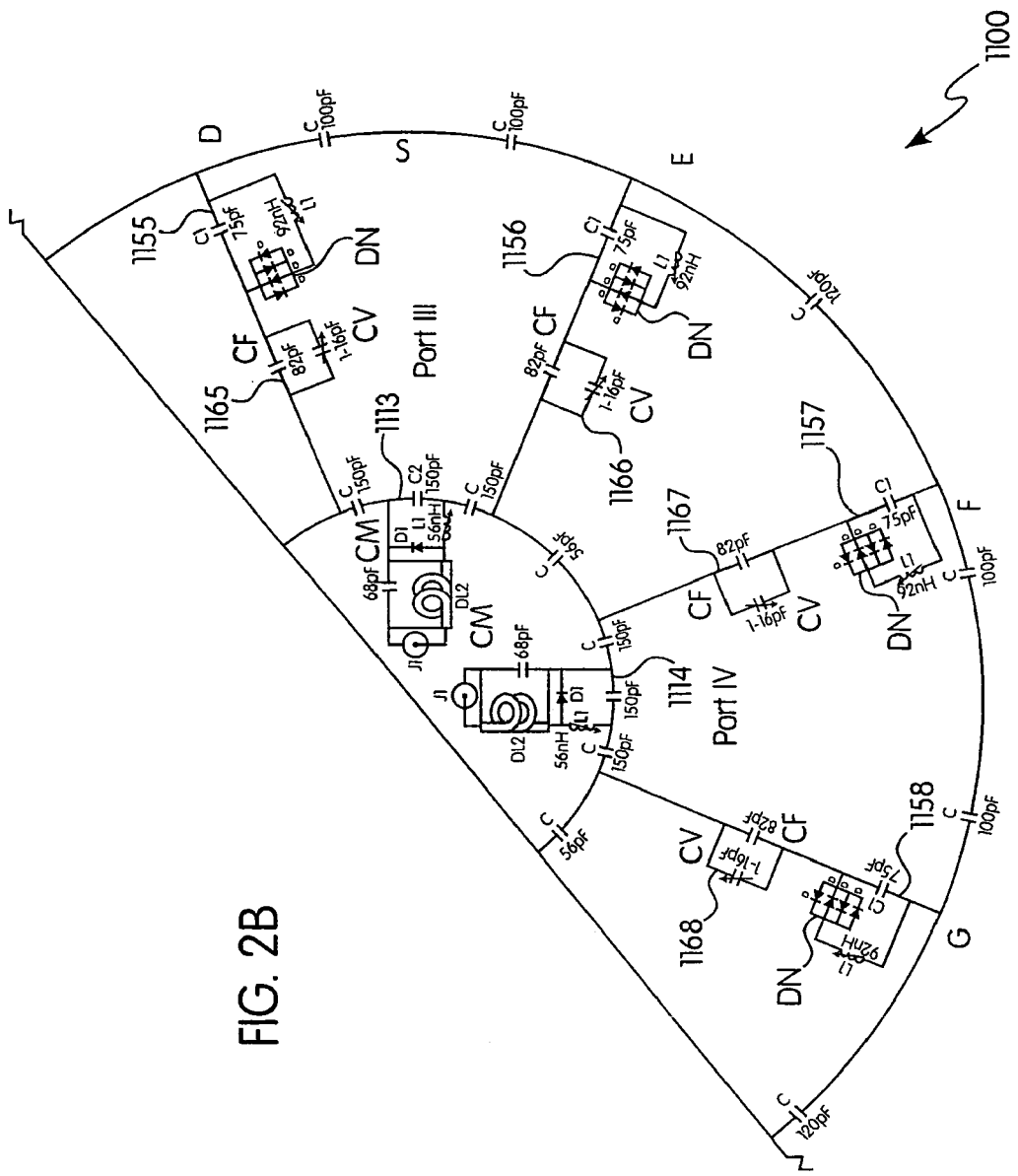
Figure 3:
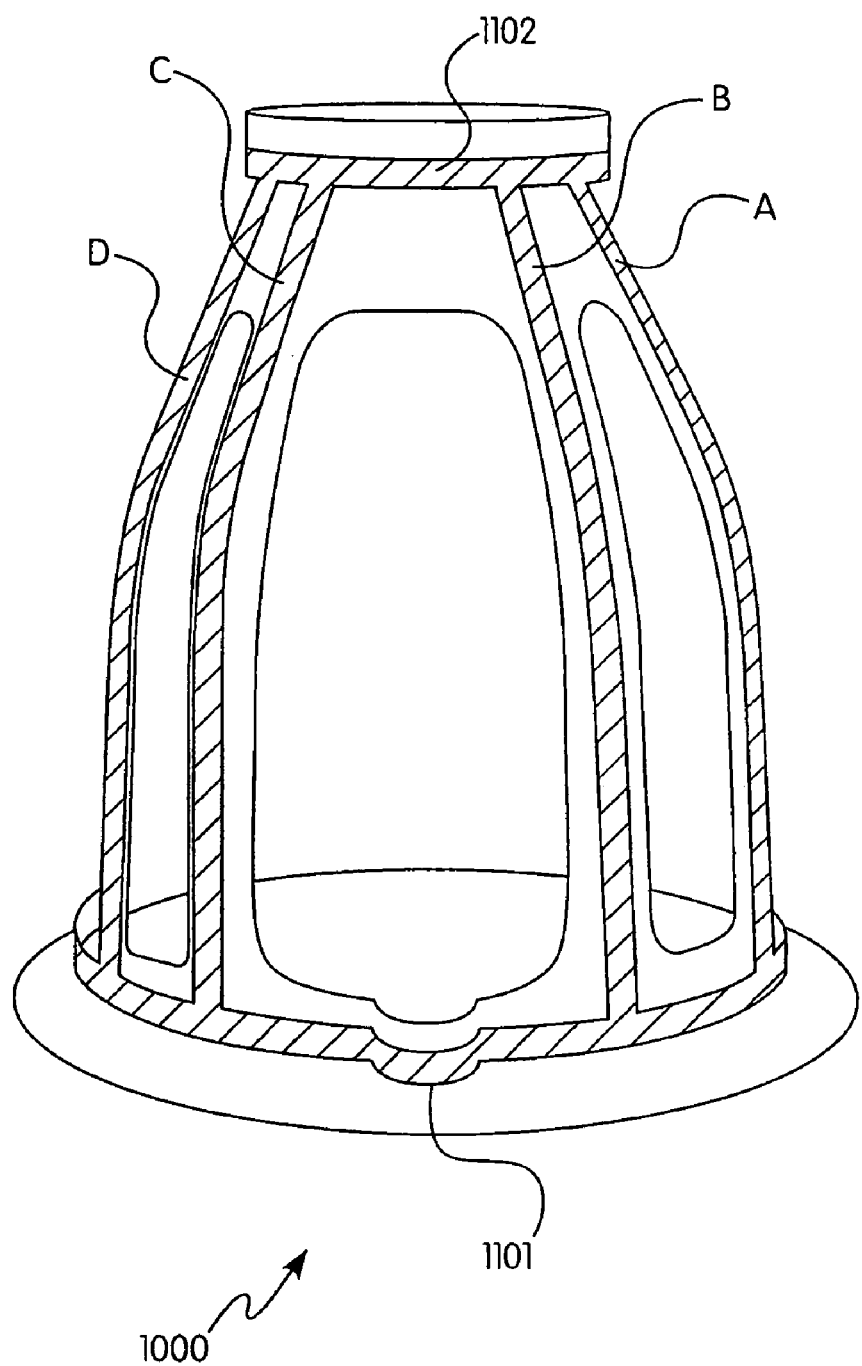
FIG. 3 is a top perspective view of a working model of the tapered birdcage resonator shown schematically in FIGS. 2A–2B.
Figure 4:
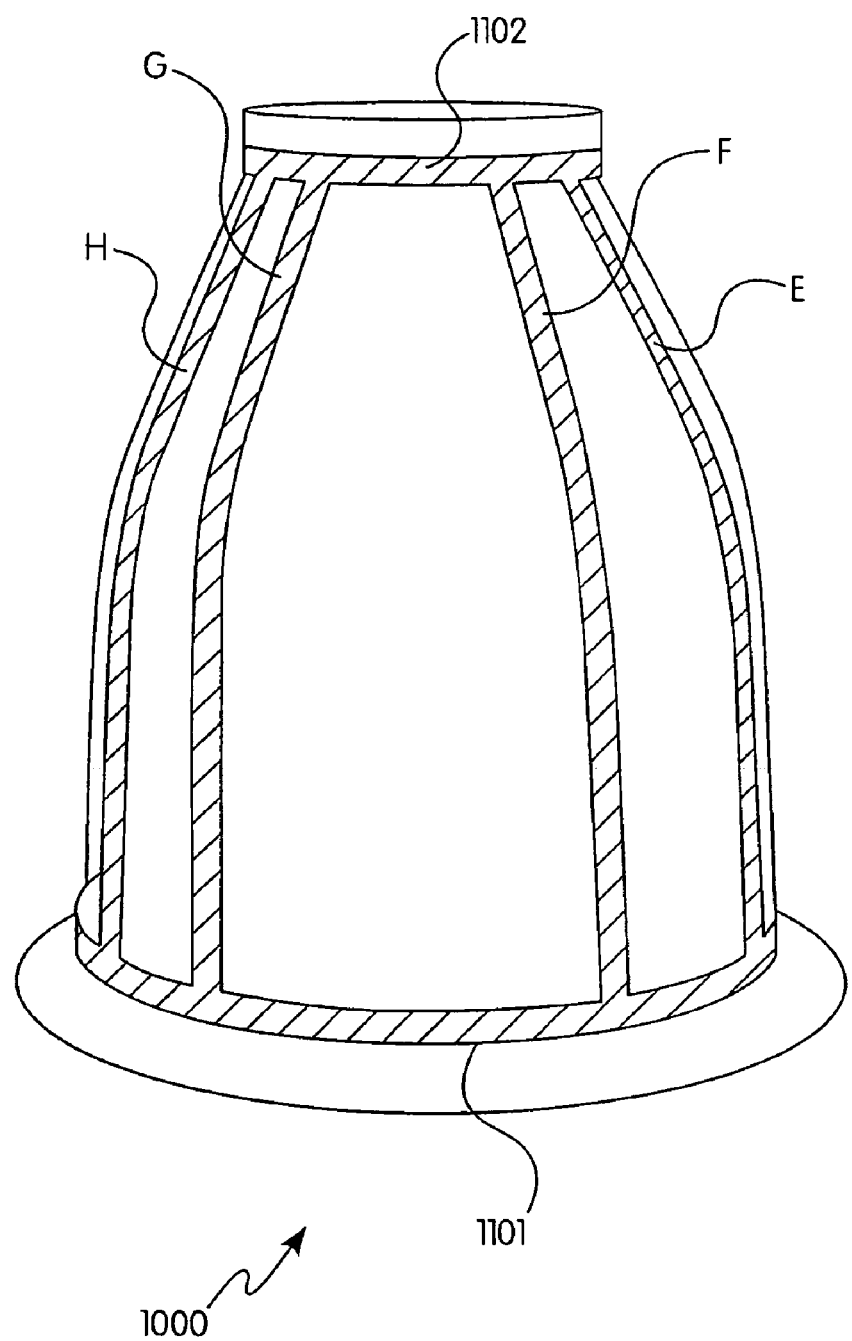
FIG. 4 is a bottom perspective view of a working model of the tapered birdcage resonator shown schematically in FIGS. 2A–2B.
Figure 5:
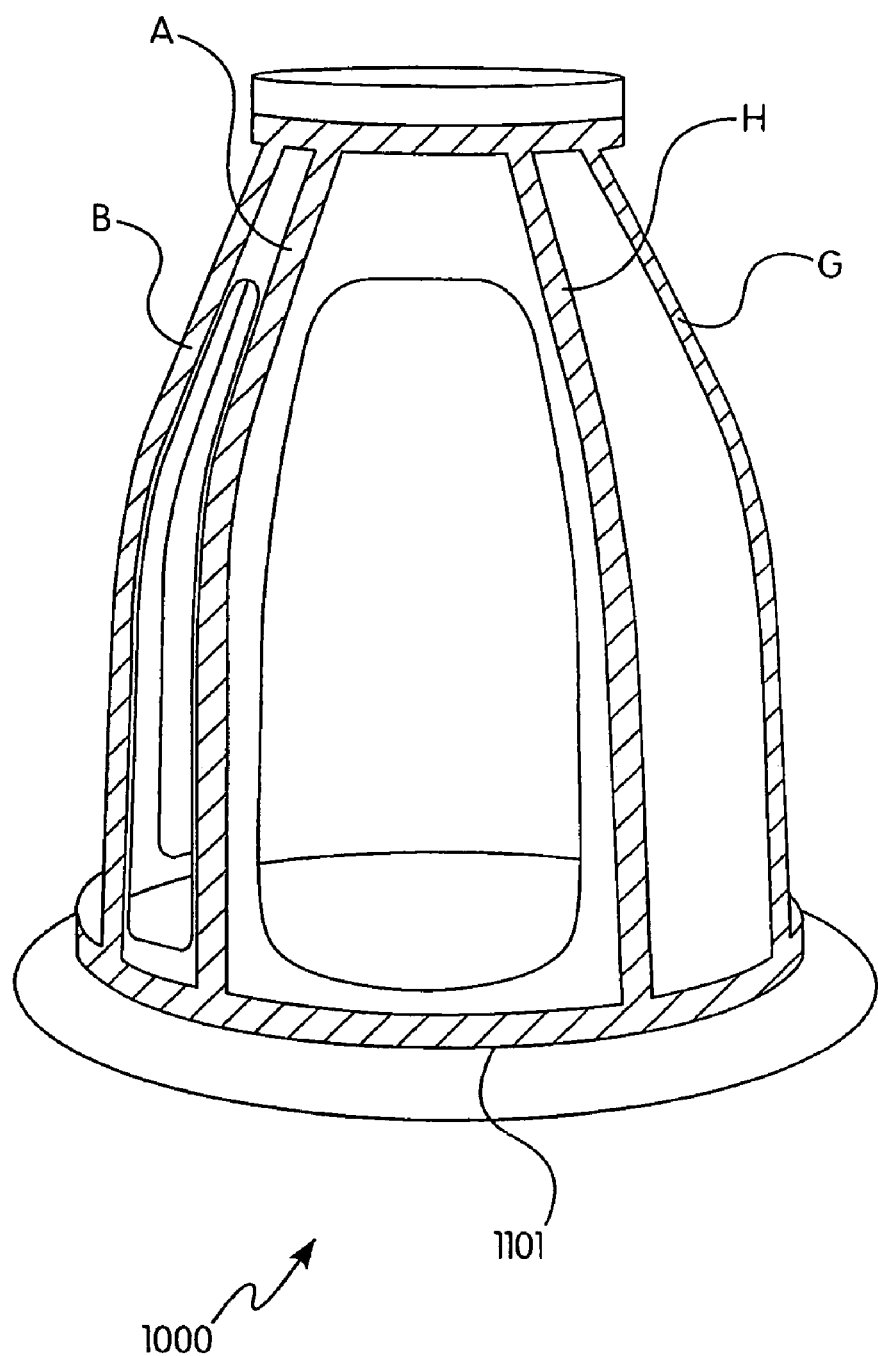
FIG. 5 is a right side perspective view of a working model of the tapered birdcage resonator shown schematically in FIGS. 2A–2B.
Figure 6:
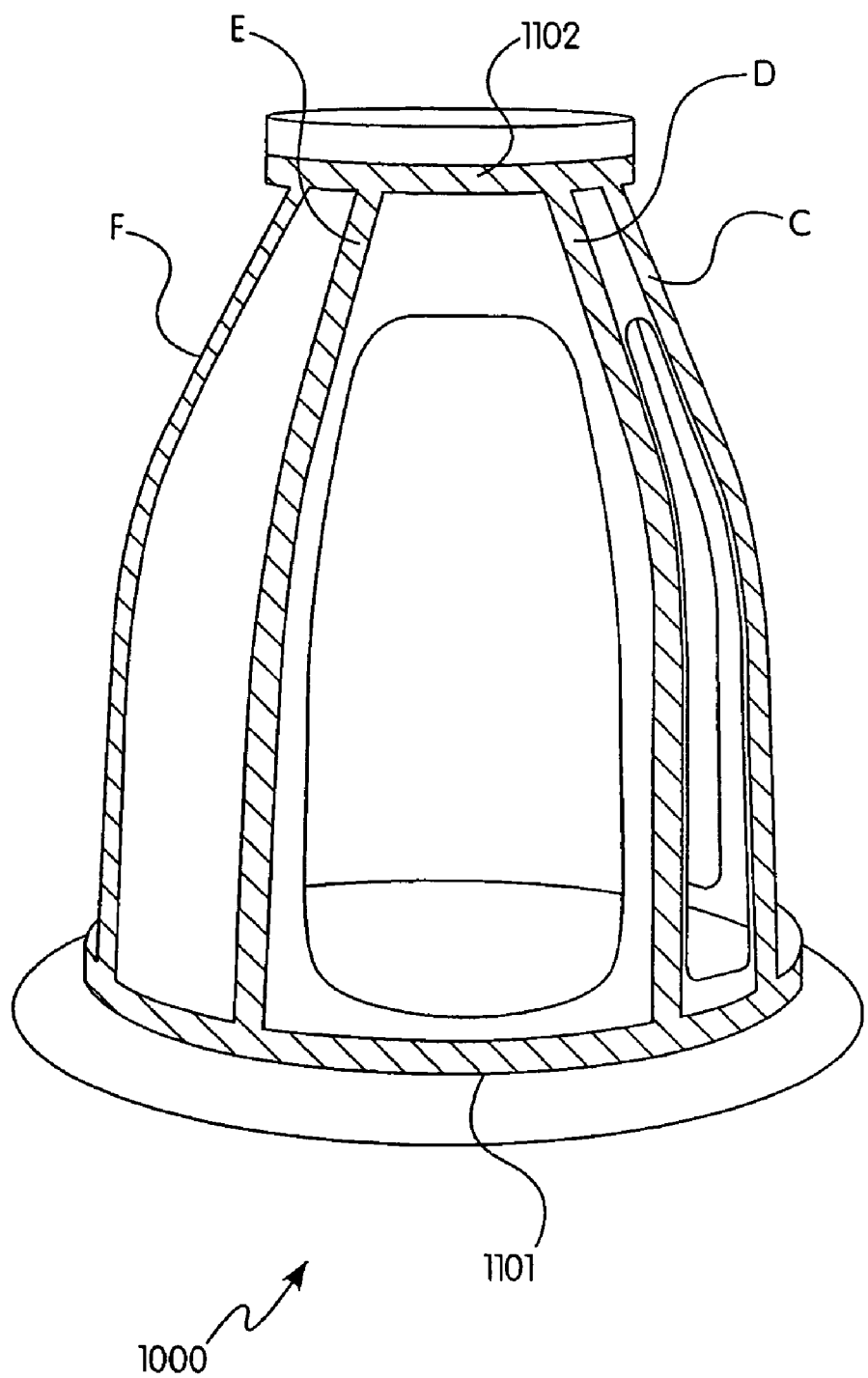
FIG. 6 is a left side perspective view of a working model of the tapered birdcage resonator shown schematically in FIGS. 2A–2B.
Figure 7:
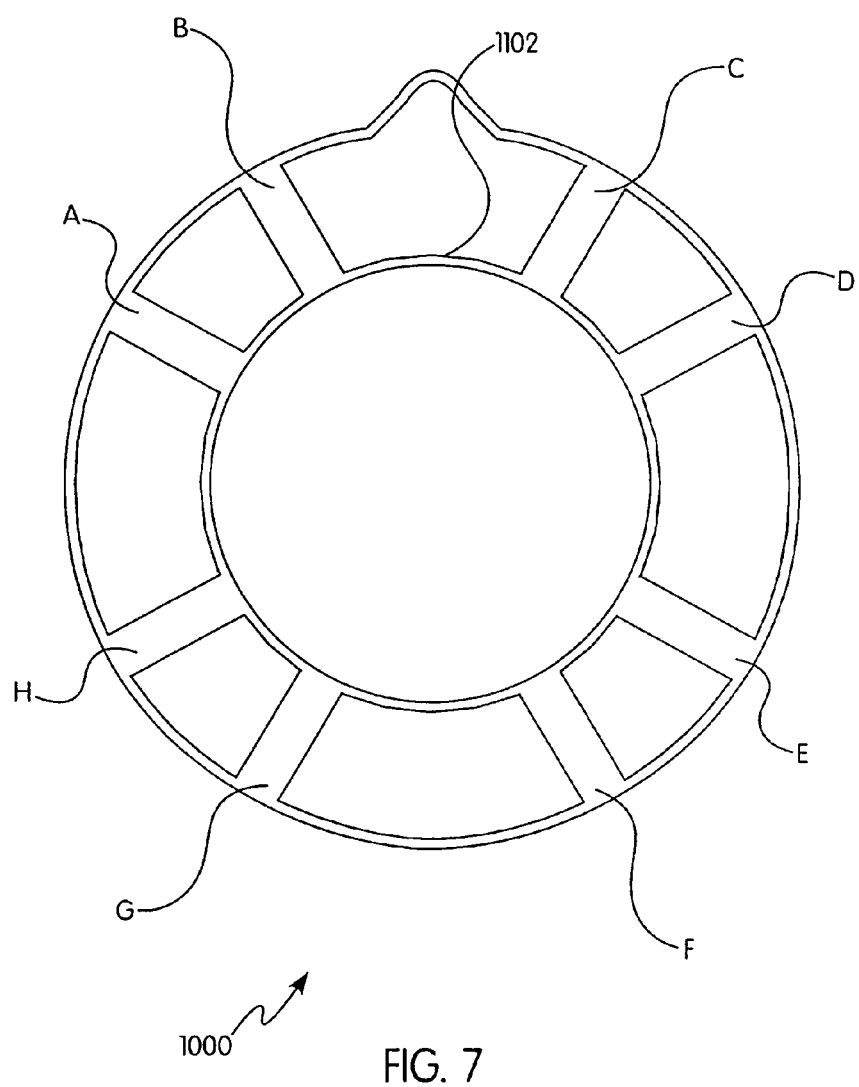
FIG. 7 is a superior-end perspective view of a working model of the tapered birdcage resonator shown schematically in FIGS. 2A–2B.

FIGS. 2A–2B illustrate a schematic diagram for a presently preferred embodiment of a tapered birdcage resonator, or Head Coil section 1000, for a Neurovascular Array (NVA), showing the circuit components and their respective values. The head coil 1000 shown in FIGS. 2A–2B is a "receive only" resonator, i.e., it does not apply the RF excitation pulses. It may, however, be configured to operate as a transnPlreceive (T/R) coil. When configured as a receive only resonator, the head coil 1000 shall be used with an external transmit coil, such as the RF body coil of the host MR system.

The tapered birdcage resonator 1000 comprises two electrically conductive end rings 1101 and 1102, one smaller than the other, interconnected by a plurality of conductive rods A–H. The first and second conductive rings 1101 and 1102 form the inferior and superior ends, respectively, of the head coil 1000. The first conductive ring 1101 has a first diameter, and the second conductive ring 1102 has a second diameter different from the first diameter. The first conductive ring 1101 may, for example, have a diameter of approximately 11.25 inches, and the second conductive ring 102 a diameter of approximately 5.875 inches. Preferably spaced at irregular distances from each other as best shown in FIGS. 3–7 and described below, the conductive rods A–H extend from the first end ring 1101. More specifically, each of the conductive rods A–H comprises a linear portion and a tapered portion, with the linear portions of the rods being connected to the first end ring 1101. Extending from the linear portions, the tapered portions connect to the second end ring 1102. The tapered portion of rods A–H may be formed from at least one angled linear segmented section. In addition, the length of the conductive rods A–H may, for example, span approximately 9.25 inches.

The exact dimensions for the diameters of the end rings 1101 and 1102 and for the lengths of the linear and tapered portions of the conductive rods A–H can be selected, of course, to suit the particular use to which the invention will be applied. Specifically, the dimensions for the components of the tapered birdcage resonator 1000 should be selected to make the head coil particularly useful for imaging regions of interest within the human head. The dimensions cited in U.S. Pat. No. 6,356,081 to Misic and U.S. Pat. No. 6,344,745 to Reisker et al, for example, will yield improved homogeneity, particularly toward the superior end of the head coil 1000. One or both of the end rings 1101 and 1102, for example, may be circular or elliptical in shape. One or both end rings may also have a diameter larger or smaller than the diameter of the center of the birdcage coil 1000. The spacing of the rods A–H from each other is also a factor, as it affects the capability of head coil 1000 to detect the MR signals emitted from tissue at the center of the imaging volume. With regard to such spacing of the rods, the ability of head coil 1000 to penetrate to the center of the imaging volume is discussed further below.

The head coil 1000 includes both passive and active decoupling networks. In the preferred embodiment in which eight conductive rods A–H are used, the head coil 1000 contains four active decoupling networks 1111–1114 (one for each mode) and eight passive decoupling networks 1151–1158 (one for each rod).

Each passive network 1151–1158 comprises a diode network DN in series with a variable inductor L1, both of which in parallel with a capacitor C1. The values of variable inductor L1 and capacitor C1 are shown in FIGS. 2A–2B for each passive network. Each diode network DN preferably contains four diodes of equal rating in parallel, with two of those diodes pointed in one direction and the other two diodes pointed in the opposite direction. Two such diodes in each direction provide parallel current paths to avoid the likelihood of burnout that could otherwise occur if only one such diode were used. Alternatively, one diode of a higher rating in each direction could be used. During the receive cycle of the host MR system, each diode network DN exhibits a high impedance, thereby effectively placing its corresponding variable inductor L1 in an open circuit. Consequently, in each of the passive networks 1151–1158, only the capacitor C1 is seen during the receive cycles.

Each conductive rod A–H also includes a tuning circuit 1161–1168 in series with its corresponding passive decoupling network 1151–1158. Each tuning circuit includes a variable capacitor CV and a fixed capacitor CF. As is well known in the art, the head coil 1000 can be tuned to optimize operation by varying the capacitance in the rods A–H via variable capacitor CV. As shown in FIGS. 2A–2B, the total adjustable range of capacitance in each of the rods is 83–98 pF. Therefore, if CF is 82 pF then the range of variable capacitor CV in parallel with CF would be 1–16 pF, as shown in FIGS. 2A–2B.

The small end ring 1102 provides an impedance matching function in addition to affecting resonance for the four operating modes of head coil 1000 as described below. Specifically, each active decoupling network 1111–1114 comprises a capacitor C2, a PIN diode D1, a variable inductor L1, and an associated port connector J1. Optionally, if separate preamplifiers are used (instead of the preamplifiers of the host MR system), each active network 1111–1114 may include an alternative matching circuit comprised of delay line/trap DL2 and its parallel capacitor CM, as shown in FIGS. 2A–2B. Each such matching circuit will provide a proper impedance match between its associated active network and the corresponding preamplifier with which it is used to interface with the host MR system.

If the preamplifiers of the MR system are used, however, the alternative matching circuits would not be required, and the shield and center conductors of each port connector J1 would merely connect to the cathode and anode, respectively, of its corresponding PIN diode D1. The capacitor C2 of each active network lies in series within the small end ring 1102. Each of the four capacitors C2 are selected, at least in part, to achieve a proper impedance match with its corresponding channel in the host 8-channel MR system. The value of capacitor C2 for each of the active decoupling networks 1111–1114 is shown in FIGS. 2A–2B.

The small end ring 1102 also contains other capacitors. For example, for the section of end ring 1102 to which active network 1111 is connected, there are two other capacitors besides capacitor C2, all three of which connected in series between rods A and H. For the section of end ring 1102 to which active network 1112 is connected, there are two other capacitor networks in series with capacitor C2 between rods B and C. For the section of end ring 1102 that accommodates active network 1113, there are two other capacitors in series with capacitor C2 between rods D and E. Similarly, for the section of end ring 1102 that contains active network 1114, there are two other capacitors in series with capacitor C2 between rods F and G. For the other four sections of end ring 1102 (i.e., between rods A & B, C & D, E & F and G & H), one capacitor spans the two adjacent rods. As is known in the art, these other capacitors are selected so as to achieve resonance for the four operating modes of head coil 1000 as described hereinafter. The values of these capacitors are shown in FIGS. 2A–2B.

Unlike an earlier version of the head coil which had regularly spaced rods, the rods A–H of head coil 1000 are preferably spaced at irregular distances from each other, as best shown in FIGS. 3–7. During testing of the earlier version, relatively high parasitic currents were found to flow in the middle two rods for each of the four operating modes/loops. Specifically, for the Port II operating loop constituting rods A and D and the sections of the two ends rings interconnecting them, such parasitic currents were found to flow in the middle two rods B and C. Similar parasitic currents were found to flow in middle rods A and H for the Port I operating loop comprising rods B and G, in middle rods D and E for the Port III operating loop comprising rods C and F, and in middle rods G and F for the Port IV operating loop comprising rods E and H. Each of these parasitic current loops tended to lower the operating quality factor, or Q, of its corresponding operating loop. While the earlier version of the head coil still provided very good high resolution images, the net result of that parasitic effect was to compromise the ability of that head coil to detect more fully the MR signals emitted from tissue at the center of the imaging volume.

The head coil 1000 of the present invention solves this problem. It was found that by bringing rods A & B closer together, as well as rods D & C, rods E & F and G & H, the parasitic effect is minimized. Consequently, as described below, the ability of the head coil to penetrate to the center of the imaging volume has been enhanced. As shown in FIGS. 3–7, despite the irregular spacing of the rods, the symmetry of the head coil is maintained, with respect to the anterior and posterior directions.

The large end ring 1101 also affects resonance for the four operating modes of head coil 1000. Unlike the design for the first embodiment of the head coil, there are variances in the values of the capacitors within the inferior end ring 1101 of head coil 1000. The values of these capacitors are shown in FIGS. 2A–2B. The different capacitive values are used to accommodate the different lengths in the sections of the end ring 1101 between adjacent rods, as best shown in FIGS. 3–7. Due the desire to make room for the nose, the section of ring 1101 between rods B & C, for example, is longer than the section opposite it, namely, the section between rods F & G. Similarly, the section of ring 1101 between rods A & B is longer than the adjacent section between A & H. Each of the different capacitive values provides a capacitive reactance that accommodates the different inherent inductances of the the respective sections of the conductive end ring 1101. This compensation scheme was implemented in the large and small end rings because the length of the rods were chosen to have the same reactive length. Furthermore, as can be seen in FIGS. 3–7 in view of FIGS. 2A–2B, the longer sections of ring 1101 (i.e., between rods B & C, D & E, F & G and H and A) have two capacitors rather than one for purposes of diminishing the electric field. This arrangement prevents the head coil from being loaded unnecessarily high at the inferior end near the shoulders, and thus avoids a reduction in the overall sensitivity of the head coil 1000. This minimizes the electric field patient coupling to the coil.

Located between rods A and H, rods B and C, rods D and E and rods F and G are the four active decoupling networks 1111, 1112, 1113 and 1114, respectively. These define the four modes of head coil 1000 for purposes of the parallel imaging techniques for which the invention is designed. As noted above, in each active decoupling network, a port connector J1 is connected across the terminals of a PIN diode D1 for purposes of decoupling and coupling the head coil from and to the host MR system, respectively. Each such port connector J1 can be connected by a coaxial cable type lead to one of the eight channels of the host 8-channel MR system for the purpose of acquiring an image of the head using parallel imaging techniques. In a preferred configuration, the head coil 1000 of the invention would therefore occupy four channels of the host 8-channel MR system, the anterior neck coil shown in FIG. 8 would occupy two channels, and the C-spine coil of FIG. 9 the last two channels. As should be apparent from this disclosure, head coil 1000 may thus be used with other local coil components to form a Neurovascular Array. Other configurations and operational modes, of course, are contemplated by this invention.

For the purposes of this discussion, each active network and its corresponding port connector J1 shall be referred to herein as a "port." For active network 1111, Port I shall denote the operating mode/loop constituting rods B and G and the sections of end rings 1101 and 1102 interconnecting them. For active network 1112, Port II shall denote the operating loop for rods A and D and the sections of end rings 1101 and 1102 interconnecting them. For active network 1113, Port III shall denote the operating mode for rods C and F and the sections of end rings 1101 and 1102 interconnecting them. For active network 1114, Port IV shall denote the operating mode for rods E and H and the portions of rings 1101 and 1102 interconnecting them. Due to the irregular spacing of the rods, each of the operating loops will resonate at the operating frequency of the host MR system, which is approximately 63.87 MHz for the GEMS Signa® 8-channel 1.5 Tesla MR system.

The operation of head coil 1000, in this preferred embodiment, is now described. During the transmit cycle (i.e., when the RF body coil is transmitting), the host MR system turns on each of the active and passive decoupling networks. Regarding the active decoupling networks 1111–1114, the host MR system sends a bias signal (e.g., 250 mA) to each of the PIN diodes D1, thus placing them in a state of forward conduction. This leaves capacitor C2 and variable inductor L1 in parallel, with the equal capacitive and inductive reactances giving rise to a parallel resonant circuit across the drive point. The resulting high impedance effectively open circuits the corresponding portion of the small end ring 1102, thus decoupling the head coil from the host MR system. Regarding the passive decoupling networks 1151–1158, the RF signal transmitted by the RF body coil turns on each passive network. The diode networks DN each respond to the RF signal by effectively short circuiting, thus yielding a parallel resonant circuit consisting of capacitor C1 and inductor L1. The resulting high impedance effectively open circuits each of the rods A–H.

During the receive cycle (i.e., when the head coil 1000 detects the MR signals emitted by the region of interest), in the absence of the RF signals, the diodes in each diode network DN of passive networks 1151–1158 present a high impedance. The impedance seen in each of the rods A–H is then only capacitor C1 of the passive networks and capacitors CF and CV of tuning circuits 1161–1168, respectively. Regarding the active networks 1111–1114, the PIN diodes D1 are each biased off. For each of the four active networks, the anode of its PIN diode D1 thus sees only the reflected low impedance of its corresponding preamplifier in the host MR system.

The head coil 1000 is thus coupled to the MR system during the receive cycle, with each of its operating loops set up as follows. From the perspective of Port I, Port I sees Ports II, III and IV as being off, i.e., as exhibiting a high impedance. This forces the resonant current I out of rod B to flow to the opposite end ring 1101 then up and through rod G through small end ring 1102 and back to Port I. The current then flows into one of the eight channels (e.g., Port 1) of the host 8-channel MR system. Similarly, from the perspective of Port II, Port II sees Ports I, III and IV as being off. This forces the resonant current I out of rod D to flow to the opposite end ring 1101 then up and through rod A through small end ring 1102 and back to Port II. This current then flows to another channel (e.g., Port II) in the host MR system. From the perspective of Port III, Port III sees Ports I, II and IV as being off. This forces the resonant current I out of rod F to flow to the opposite end ring 1101 then up and through rod C through small end ring 1102 and back to Port III. The current then flows to the Port III channel of the host MR system. Lastly, from the perspective of Port IV, Port IV sees Ports I, II and III as being off. This forces the resonant current I out of rod H to flow to the opposite end ring 1101 then up and through rod E through small end ring 1102 and back to Port IV. This current then flows to the Port IV channel of the host 8-channel MR system.

The head coil according to the present invention thus yields a four-legged resonant structure. More specifically, the rods A–H and end rings 1101 and 1102 are configured to form a plurality of partially-overlapped primary resonant substructures about the birdcage. Each of the primary resonant substructures includes two of the rods and a corresponding section of each of the first and second rings interconnecting them. For example, the Port I resonant substructure includes rods B and G and the sections of end rings 1101 and 1102 interconnecting them, and the Port II resonant substructure includes rods D and A and the sections of end rings 1101 and 1102 interconnecting them. Likewise, the Port III resonant substructure includes rods F and C and the sections of end rings 1101 and 1102 interconnecting them, and the Port II resonant substructure includes rods H and E and the sections of end rings 1101 and 1102 interconnecting them. The preferred embodiment above thus has four primary resonant substructures, each of which is sensitive to receiving magnetic resonance signals from its corresponding portion of the head or other sampled region. For an MR system capable of acquiring images of a region of interest using parallel imaging techniques, the primary resonant substructures of head coil 1000 are thus capable of being used by that MR system for simultaneous reception of magnetic resonance signals from that region of interest. The region of interest is the entire sample enclosed by the head coil and/or any part thereof. All of the primary resonant substructures are tuned to resonate at the Larmor frequency.

Figure 10:
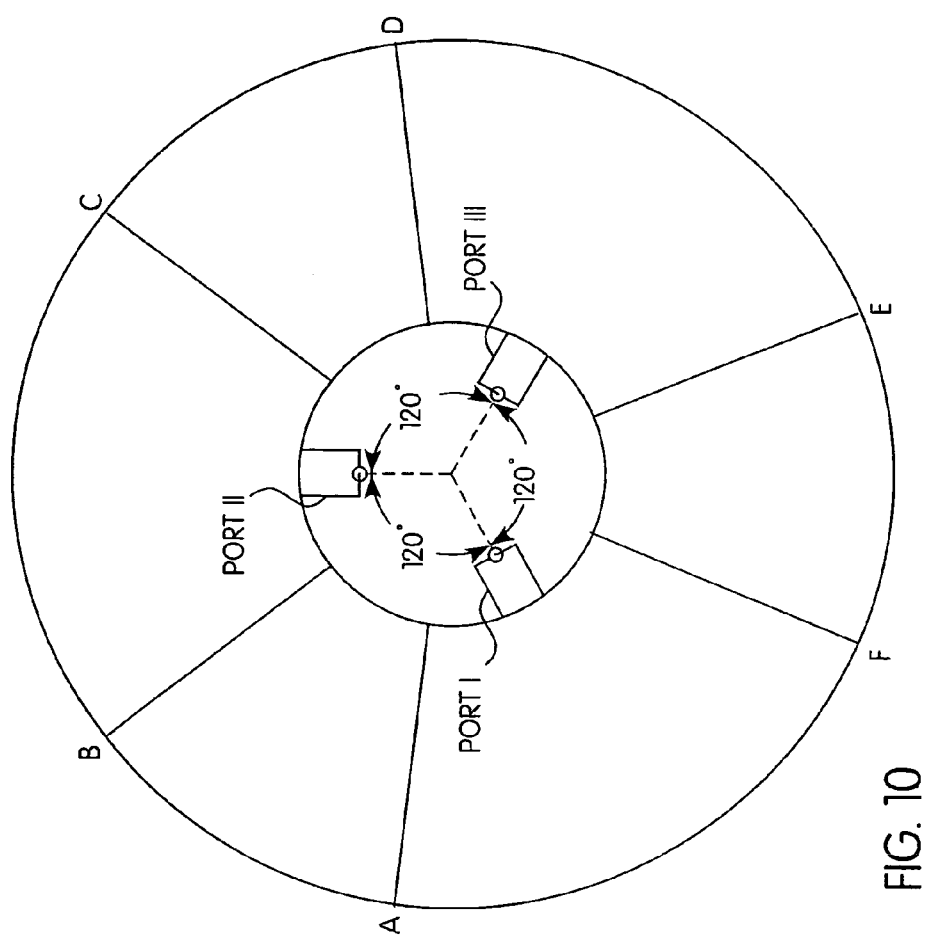
FIG. 10 is a generalized diagram of a birdcage resonator according to a second embodiment of the invention, in which the birdcage resonator has six rods and is capable of providing three primary resonant substructures.

The partially-overlapped primary resonant substructures are deployed generally symmetrically about the birdcage coil. For the preferred embodiment, there are four such primary resonant substructures for the 8-rod head coil, with each being substructure generally deployed 90 degrees apart. In the alternative embodiment shown in FIG. 10, there would be three primary resonant substructures for a 6-rod head coil, with each substructure being generally deployed 120 degrees apart. For example, the Port I resonant substructure would include rods B and E and the corresponding sections of the end rings interconnecting them, and the Port II resonant substructure would include rods D and A and the sections of the end rings interconnecting them. Similarly, the Port III resonant substructure would include rods F and C and the sections of the end rings interconnecting them.

Figure 11:
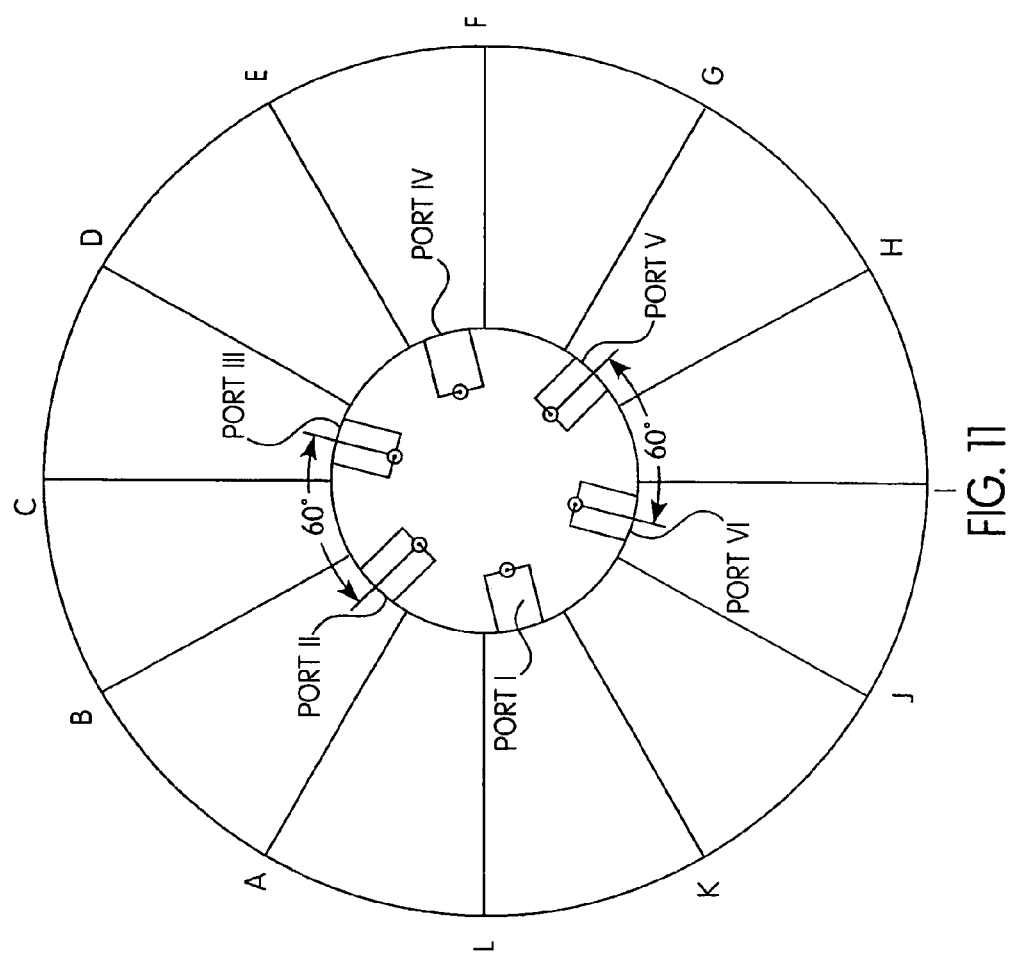
FIG. 11 is a generalized diagram of a birdcage resonator according to a third embodiment of the invention, in which the birdcage resonator has twelve rods and is capable of providing six primary resonant substructures.
Figure 12:
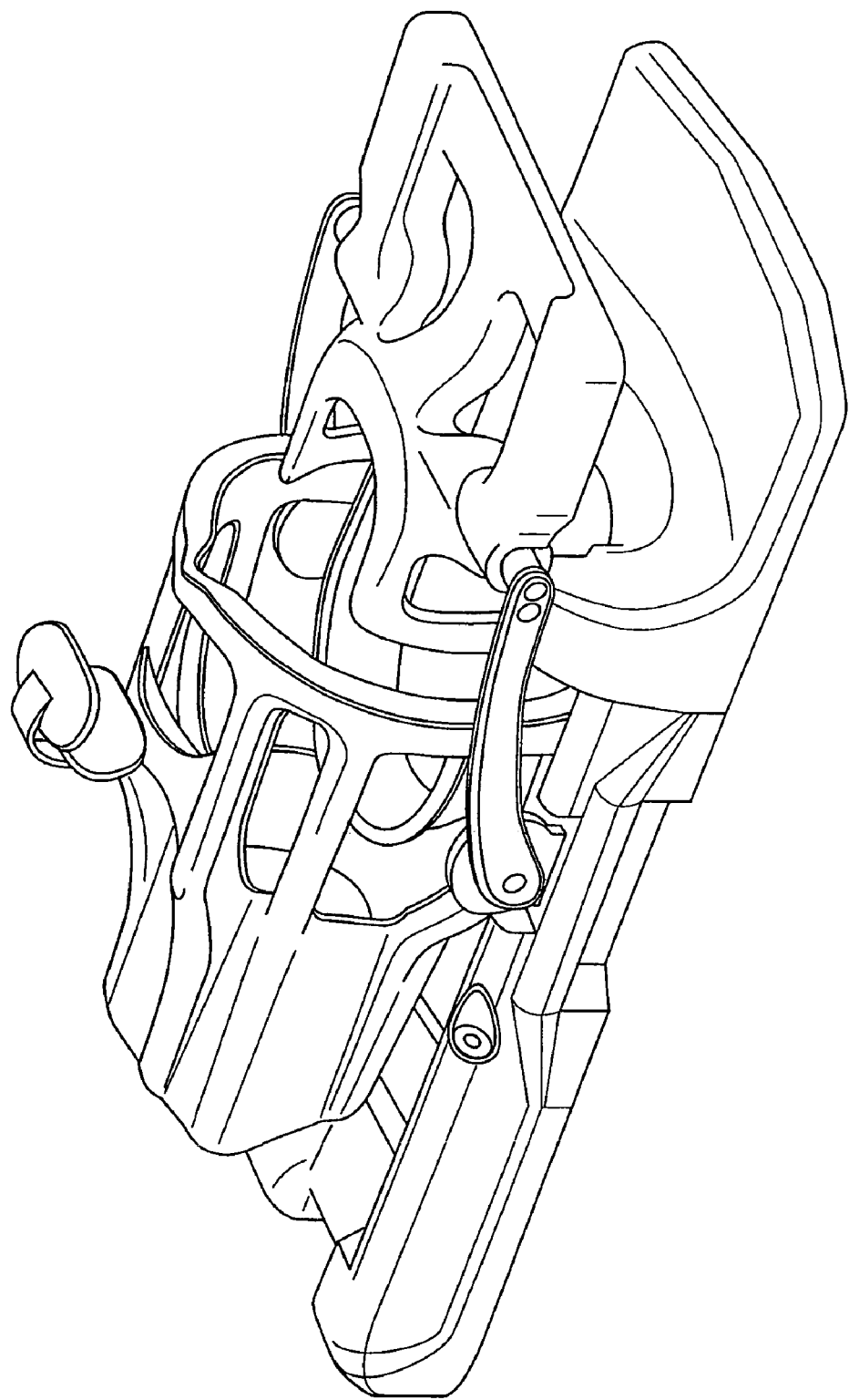
FIG. 12 is an isometric view of a preferred embodiment of a Neurovascular Array, inclusive of the Head Coil section of FIGS. 2A–7, the Anterior Neck Coil section of FIG. 8, the Posterior Cervical Spine Coil section of FIG. 9, and a Base section.

In another embodiment shown in FIG. 11, there would be six primary resonant substructures for a 12-rod head coil, with each substructure being generally deployed 60 degrees apart. For example, the Port I resonant substructure would include rods A and J and the corresponding sections of the end rings interconnecting them, and the Port II resonant substructure would include rods C and L and the sections of the end rings interconnecting them. Similarly, the Port III resonant substructure would include rods E and B and the sections of the end rings interconnecting them, and the Port IV resonant substructure would include rods G and D and the sections of the end rings interconnecting them. Likewise, the Port V resonant substructure would include rods I and F and the sections of the end rings interconnecting them, and the Port VI resonant substructure would include rods K and H and the sections of the end rings interconnecting them. As discussed in connection with the preferred embodiment, the rods are preferably spaced at irregular distances from each other.

As will be apparent to persons of ordinary skill in the art, the head coil of the present invention also has secondary resonant substructures. One such secondary resonant substructure, for example, includes rods B and A and the sections of end rings 1101 and 1102 interconnecting them. Another includes rods B and H and the sections of end rings 1101 and 1102 interconnecting them. Yet another includes rods A and G and the sections of end rings 1101 and 1102 interconnecting them. Unlike the primary resonant substructures, the secondary substructures variously resonate at frequencies sufficiently above or below the Larmor frequency and thus have a minimal adverse affect on the overall performance head coil 1000 (e.g., some minimal reduction in mode-to-mode isolation).

The design of head coil 1000 is superior compared to approaches adopted by other manufacturers. MRI Devices Corporation of Waukesha, Wis., for example, has also made a head coil to be used with MR systems capable of parallel imaging. The MRI Devices' head coil features four overlapped loops, which provide less coverage of the sensitive region and exhibits a 2 to 1 drop in sensitivity between points near the conductive rods and those at the center of the region of interest. Head coil 1000 of the invention, however, provides greater coverage of the sensitive region. It also exhibits approximately only a 1.4 to 1 drop in sensitivity between points near the conductive rods and those at the center of the region of interest. By bringing the rods closer together as disclosed herein, the aforementioned parasitic effects have been minimized. This yield an improvement in the signal-to-noise ratio while allowing the head coil to obtain consistently only a 1.4 to 1 drop in sensitivity between points near the rods and those at the center of the imaging volume. The preferred embodiment is thus an advance over the earlier version, as the ability of the head coil to penetrate to the center of the imaging volume has been enhanced.

It should also be understood that a preamplifier may optionally be added to each of the active decoupling networks 1111–1114, in which case an alternative matching circuit comprised of delay line/trap DL2 and its parallel capacitor CM would be needed in each active network, as shown in FIGS. 2A–2B. In this variation, the corresponding preamplifier in the host 8-channel MR system would no longer be needed. In addition, the invention herein disclosed may be used with the existing 9.X software used with the GEMS Signa 8-channel 1.5 Tesla MR system.

The tapered birdcage resonator 1000 can take form in various configurations of components and component placement. The depiction of FIGS. 2A–2B, which illustrates a band pass configuration, is for the purpose of illustrating a preferred embodiment and is not to be construed as limiting the invention. In particular, the components alternatively may be selected and placed, in a manner known to those skilled in the art, to create a low pass or high pass configuration of the tapered birdcage resonator 1000.

The head coil 1000 may also be configured to be a transmit/receive (T/R) coil. This would require removal of the active decoupling networks 1111–1114 from the second end ring 1102 and the passive decoupling networks 1151–1158 from the rods A–H. In addition, the transmit power (RF energy) from the transmitter port of the host MR system would have to be properly split and routed to the port of each of the primary resonant substructures with the appropriate phase during the transmit cycle.

As will become apparent from the disclosure below, head coil 1000 may be used with other local coil components to form a neurovascular array. For example, the head coil 1000 can be used with an anterior neck coil and a cervical spine coil in a plug type of arrangement known in the art. In one such configuration, the head coil 1000 of the invention would occupy four channels of the host 8-channel MR system, the anterior neck coil shown in FIG. 8 would occupy two channels, and the C-spine coil of FIG. 9 the last two channels. Other configurations and operational modes, of course, are contemplated by this invention.

Figure 13:
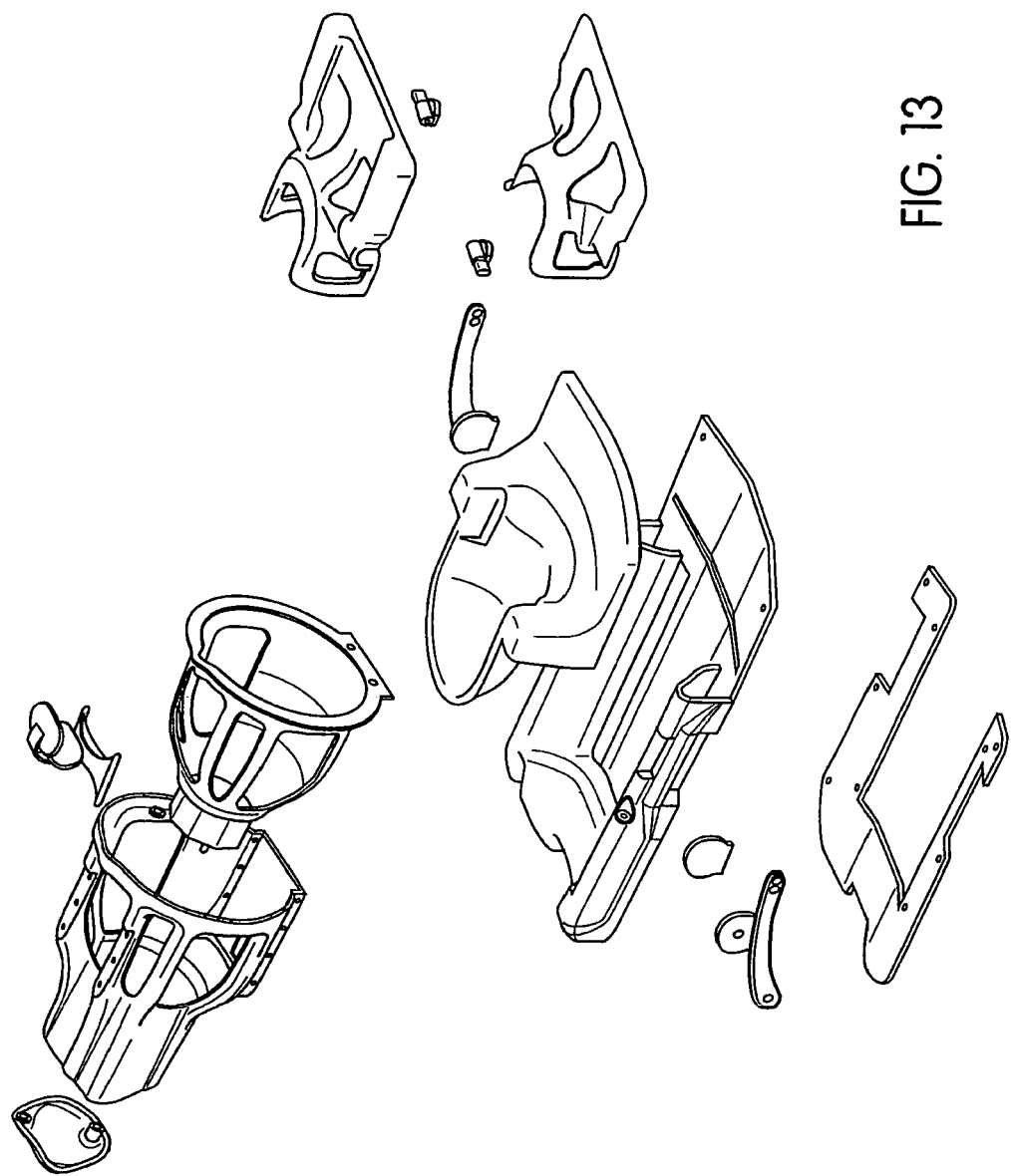
FIGS. 13 and 14 are exploded views of the Neurovascular Array of FIG. 12, showing (i) the cover and outer and inner housings of the Head Coil section; (ii) the mirror assembly for the Head Coil Section, (iii) the outer and inner housings of the Anterior Neck section, (iv) the paddle arms and pivot damper assemblies for the Anterior Neck section, (v) the Cervical Spine section and (vi) the base and cover for the Base section.
Figure 14:
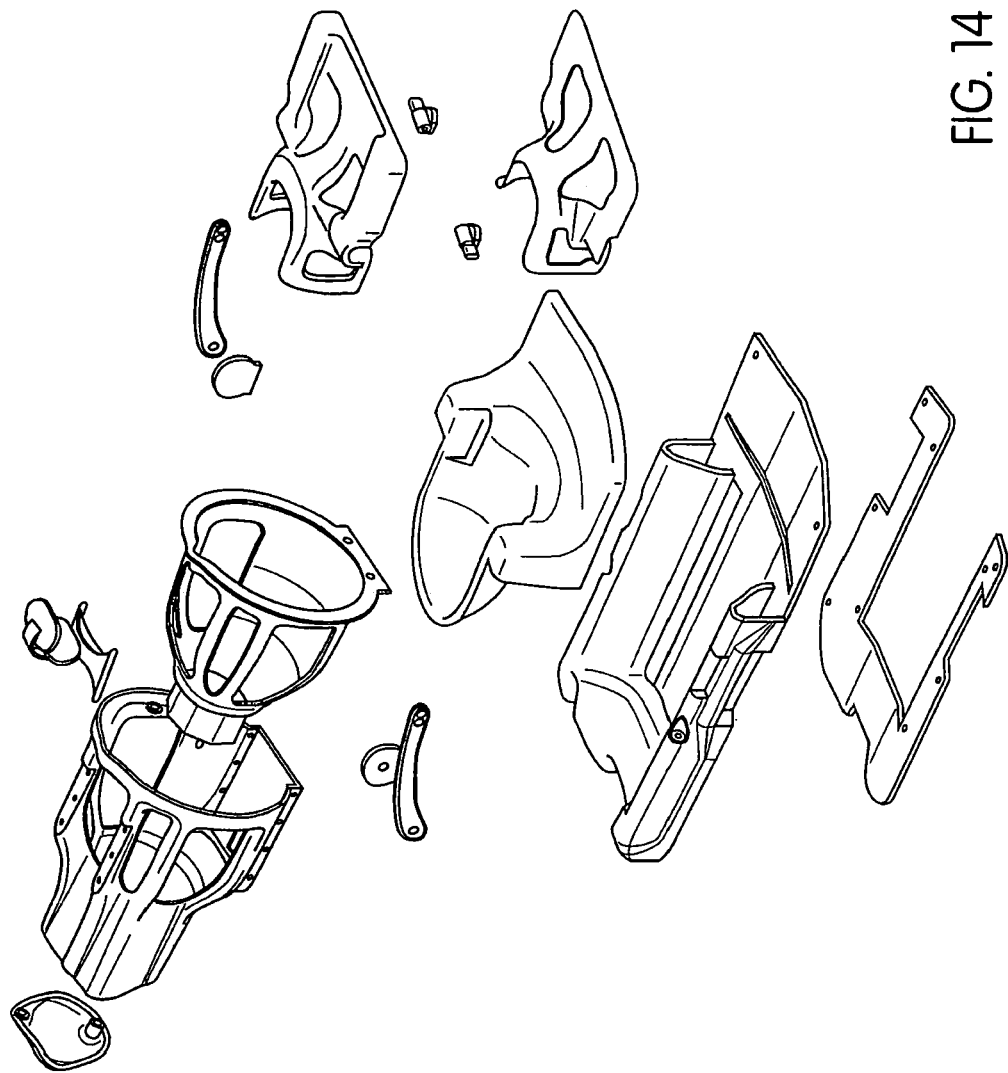
Figure 15:
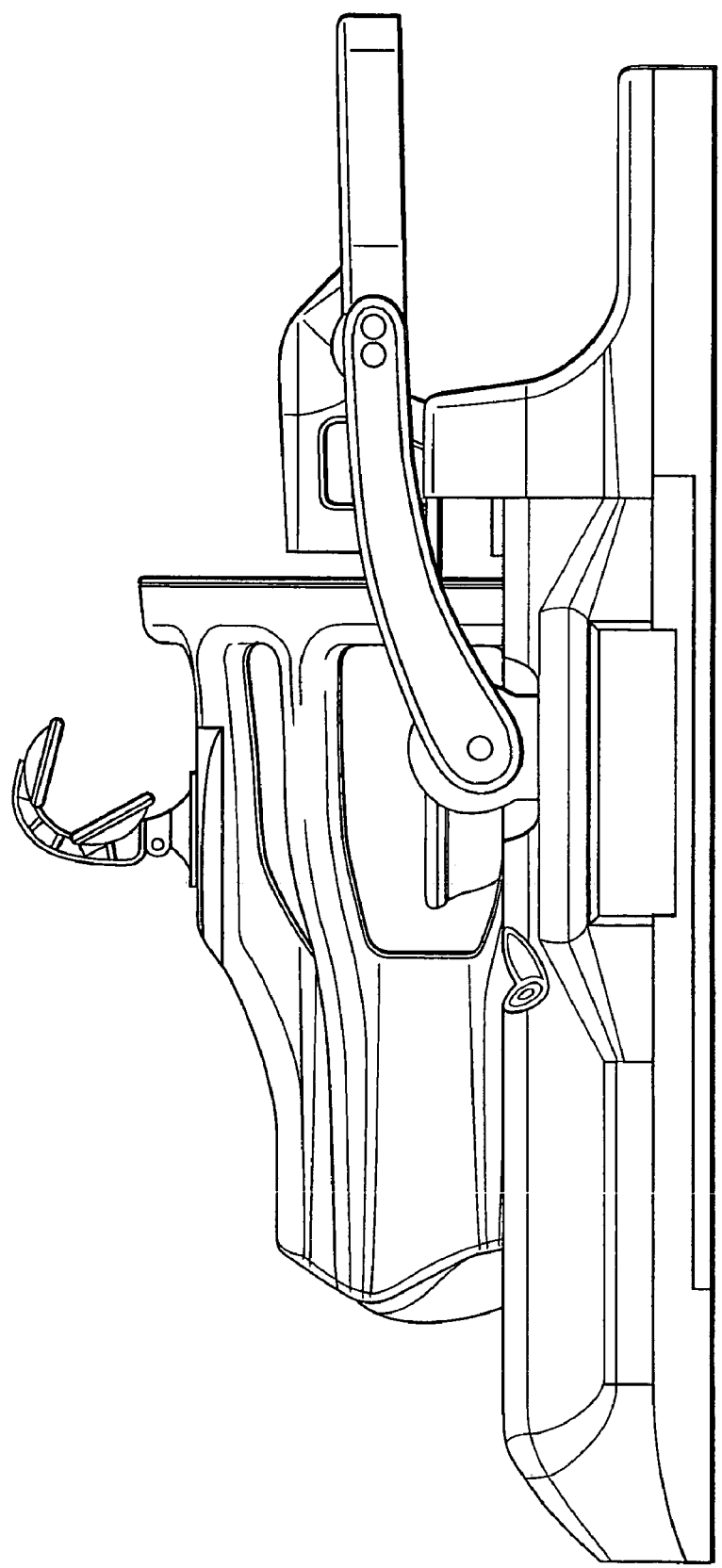
FIG. 15 is a left side view of the Neurovascular Array, which illustrates (i) the Head Coil section at the inferiormost end of its travel (i.e., closed position) and (ii) the pivotable Anterior Neck section lowered to a fully engaged position.
Figure 16:
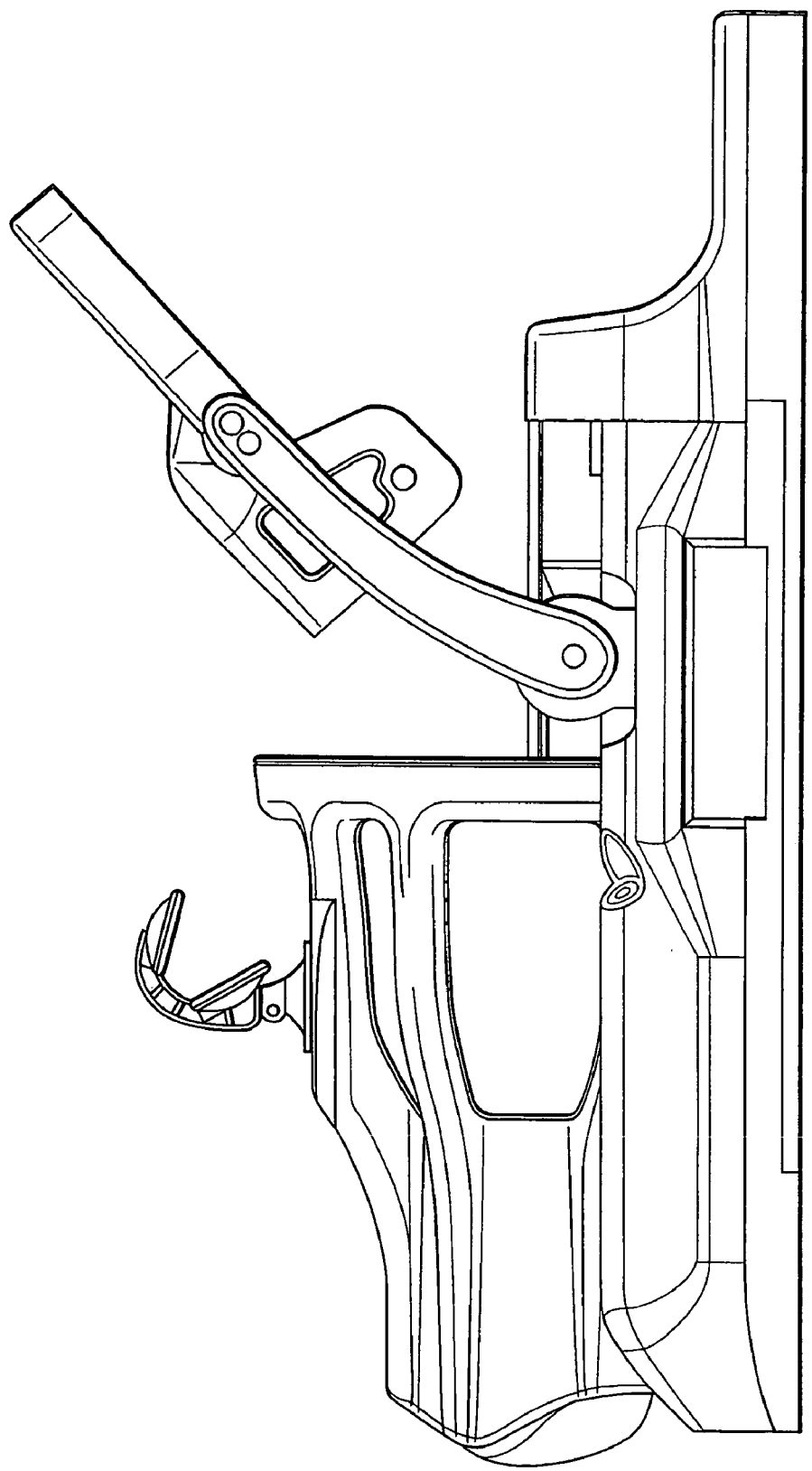
FIG. 16 is a left side view of the Neurovascular Array, which shows (i) the slidable Head Coil section having been moved to the superiormost end (i.e., open position) and (ii) the pivotable Anterior Neck section in an upright position.
Figure 17:
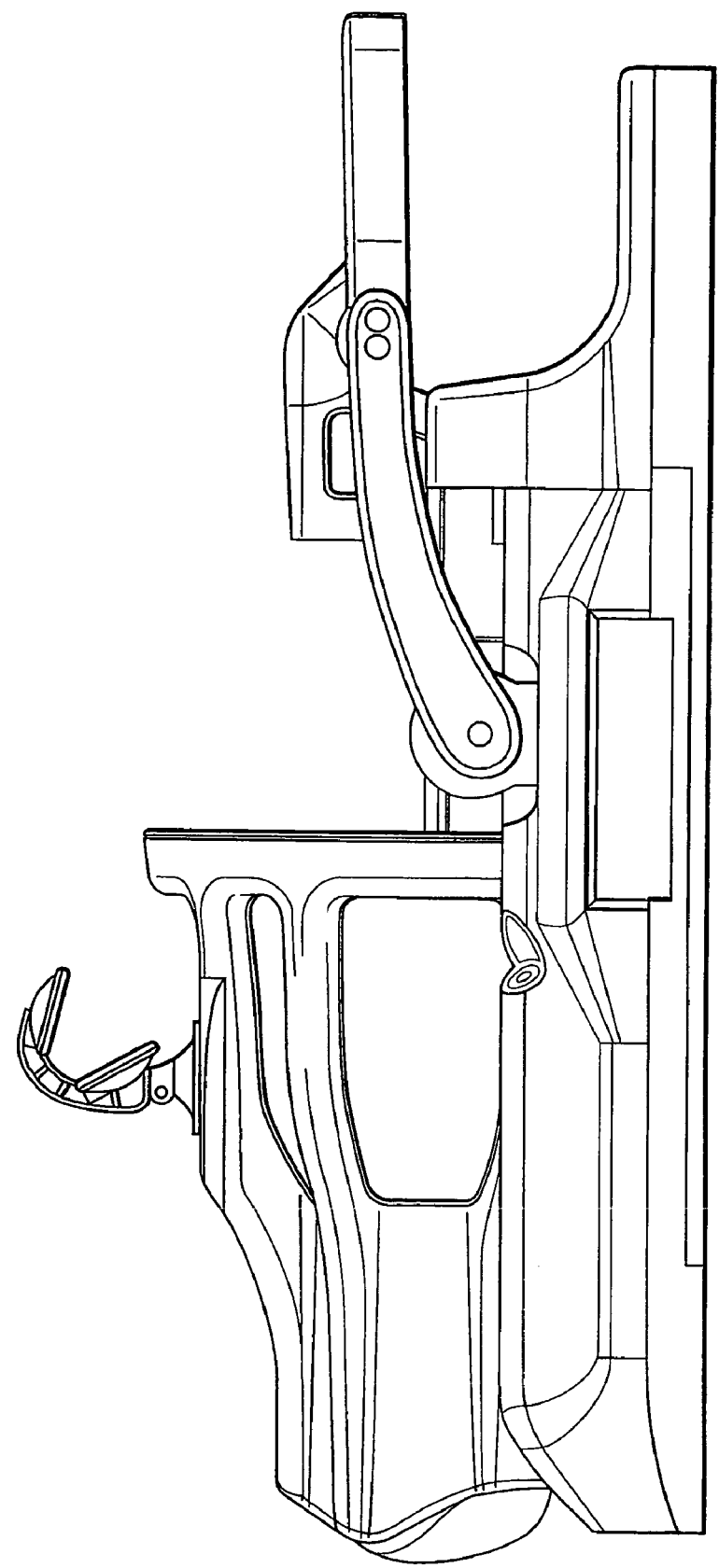
FIG. 17 is a left side view of the Neurovascular Array, which shows (i) the slidable Head Coil section in the open position and (ii) the pivotable Anterior Neck section lowered to the fully engaged position.
Figure 18:
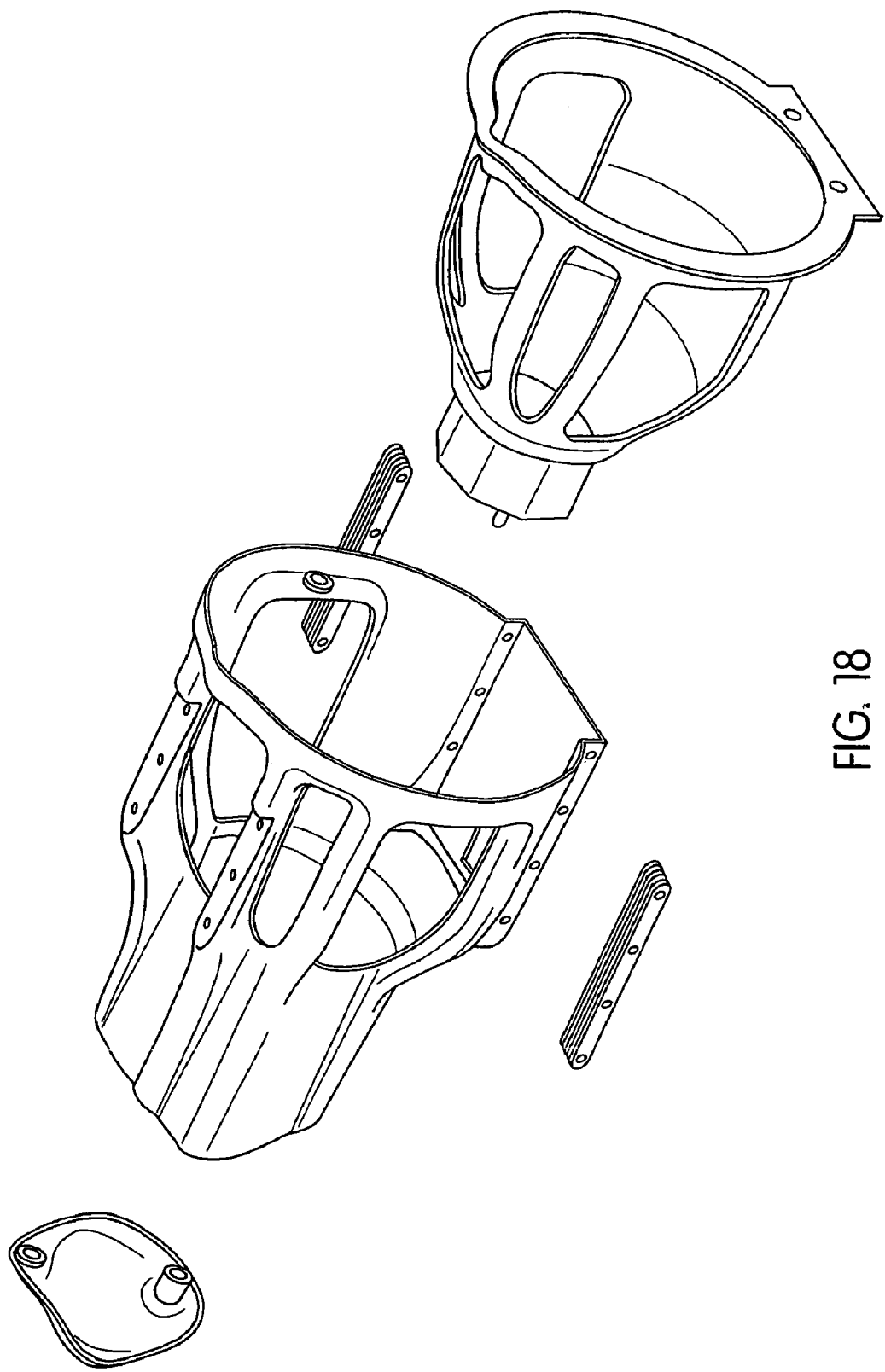
FIG. 18 is an exploded view of the Head Coil section showing the cover thereof, the inner and outer housings thereof and the sliders thereof.
Figure 19:
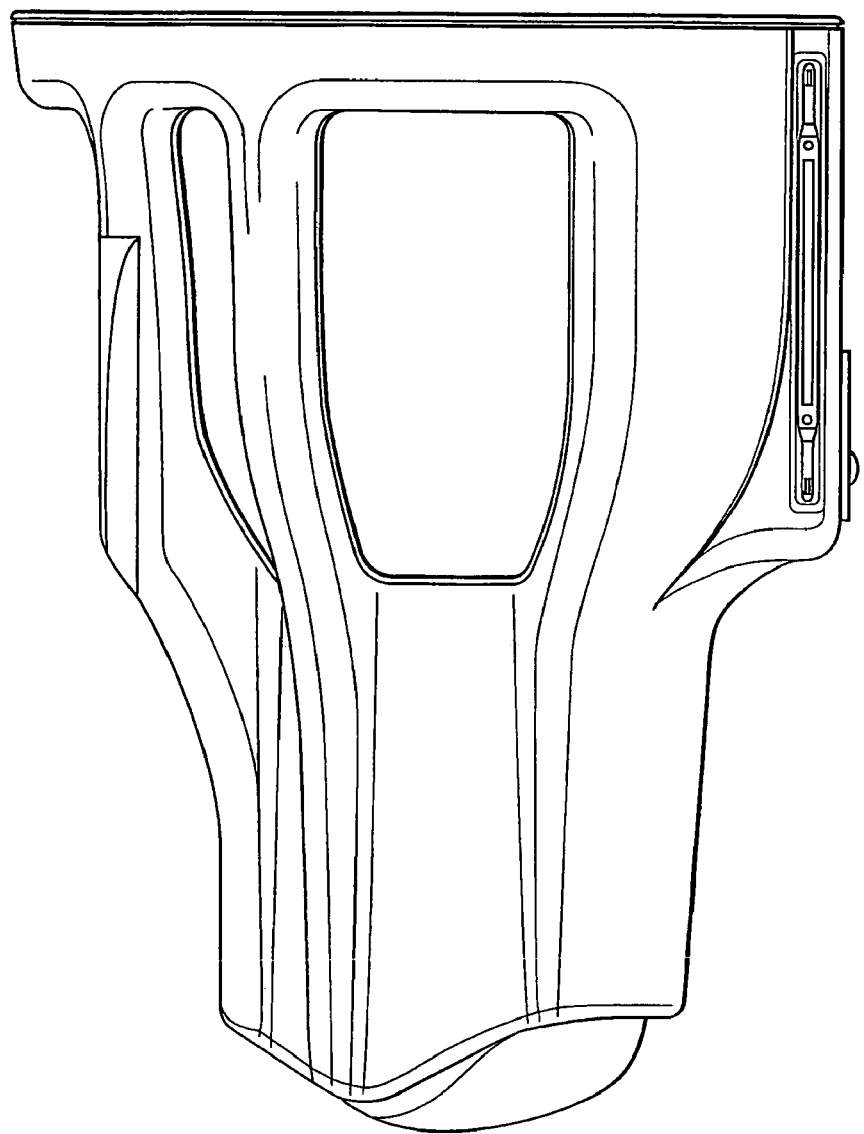
FIG. 19 is a left side view of the Head Coil section showing the roller assembly and one of the two sliders on the bottom of the Head Coil section.
Figure 20:
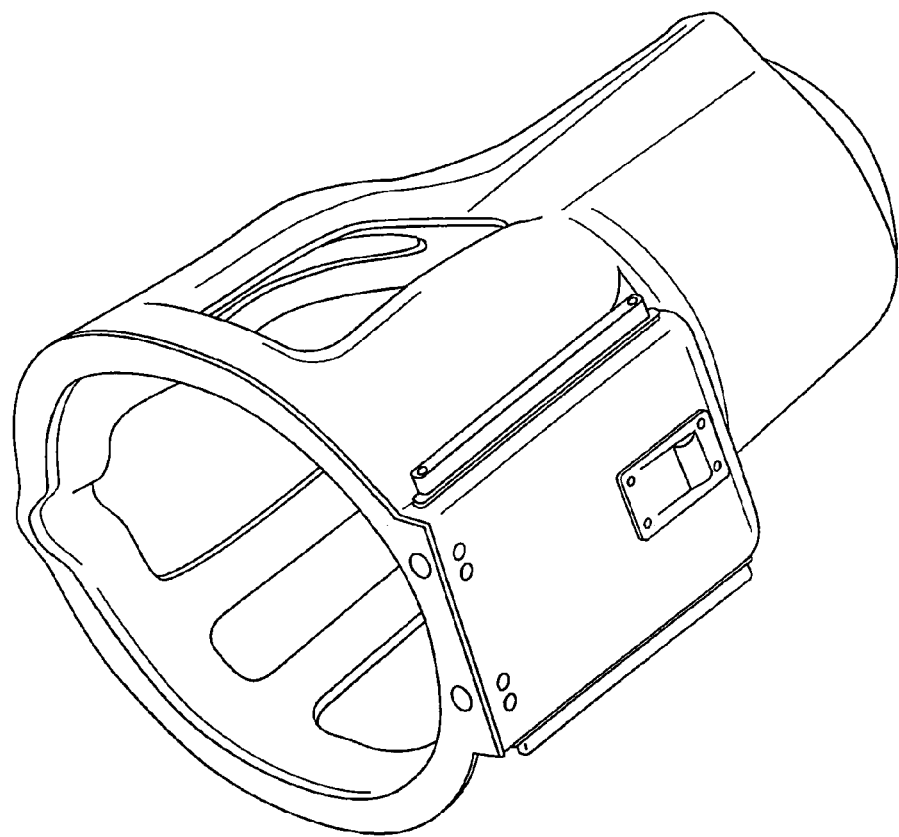
FIG. 20 is a bottom isometric view of the Head Coil section showing the roller assembly and a slider on each side of the bottom of the Head Coil section.
Figure 21:
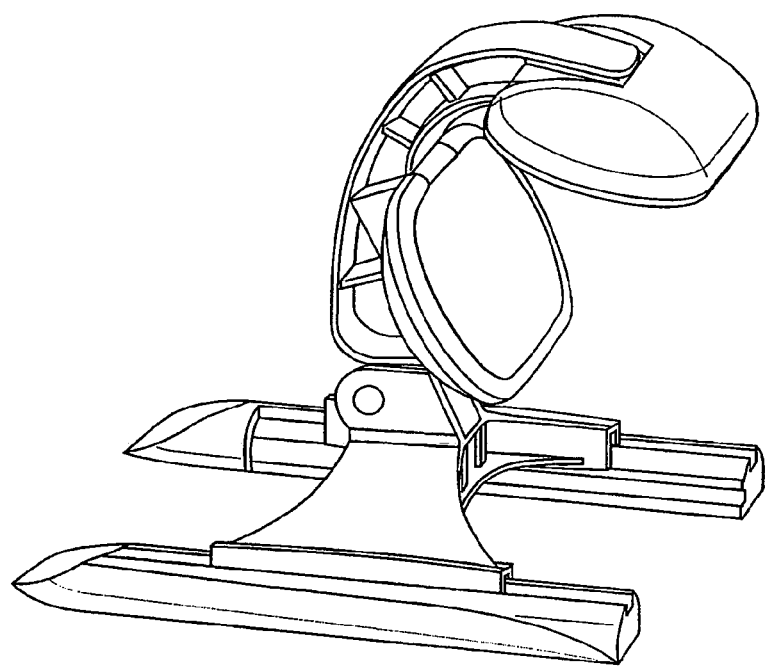
FIG. 21 is an isometric view of the mirror assembly for the Head Coil section of the Neurovascular Array.
Figure 22:
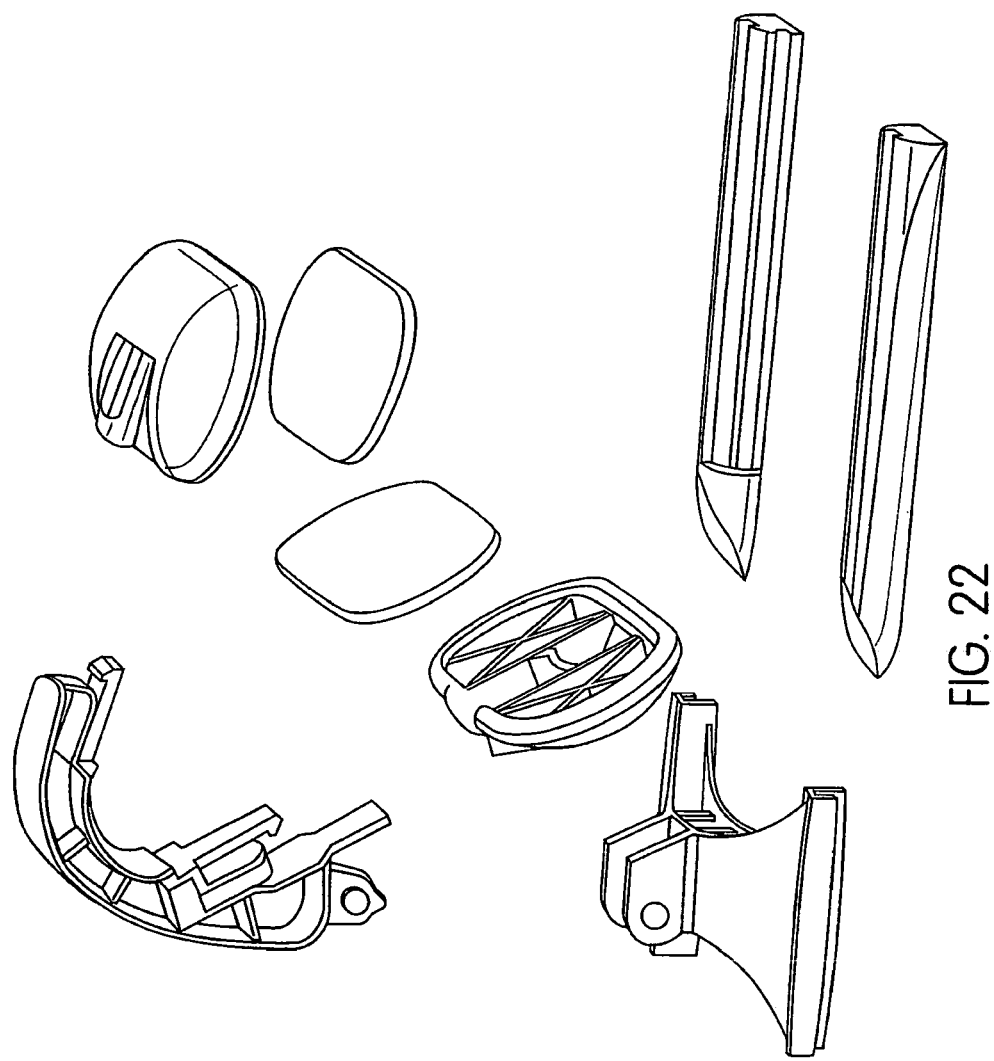
FIG. 22 is an exploded view of the mirror assembly shown in FIG. 21.

FIGS. 12–22 illustrate one type of neurovascular array into which the head coil 1000 of the preferred embodiment can be incorporated. The neurovascular array comprises the head coil section, an anterior neck coil section, a posterior cervical spine (or "C-spine") coil section, and a base section. More particularly, as shown in the exploded views of FIGS. 13 and 14, the neurovascular array basically includes a housing for each of its coil sections. The head coil section, for example, has an inner and outer housings between which is secured the circuitry of head coil 1000 according to the schematic of FIGS. 2A–2B. FIGS. 12–14 and 21–22 also show the mirror assembly that connects to the head coil section. FIGS. 13–14 also show the housing(s) to which the circuitry of the posterior C-spine coil can be secured according to the schematic of FIG. 9. The base section upon which the C-spine section is fixed is also illustrated in FIGS. 12–17. The head coil section is slideably attached to the base section by means of a slider channel assembly and a roller assembly. The slider channel and roller assemblies are best shown in FIGS. 18–20.

Figure 8:
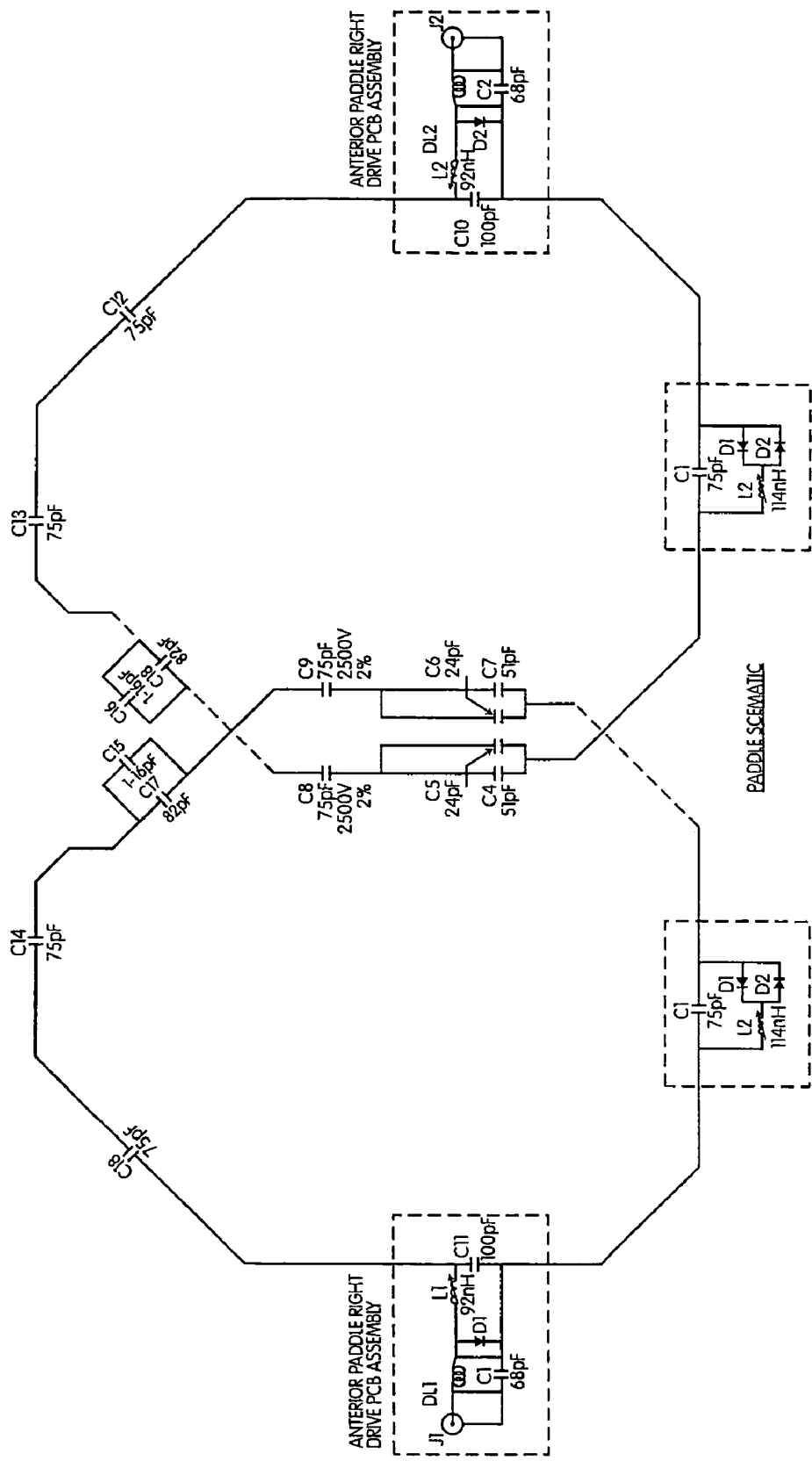
FIG. 8 is a schematic circuit diagram for a preferred embodiment of an Anterior Neck Coil section for a Neurovascular Array.
Figure 9:
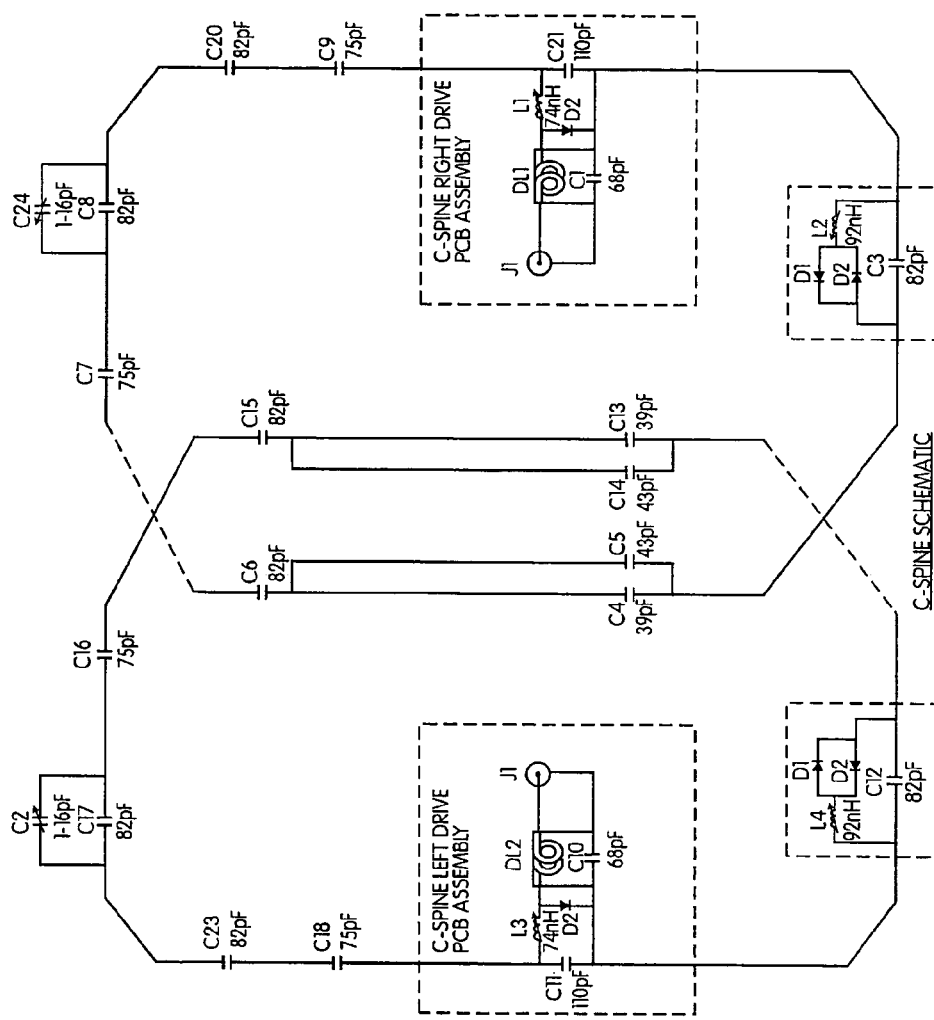
FIG. 9 is a schematic circuit diagram for a preferred embodiment of a Posterior Cervical Spine Coil section for a Neurovascular Array.

FIGS. 13 and 14 also show the outer and inner housings respectively, between which the circuitry of the anterior neck coil can be secured according to the schematic of FIG. 8. The paddle arms and pivot damper assemblies for the anterior neck section are also shown. Besides allowing the anterior neck section to be pivoted between the fully engaged position shown in FIG. 15 and the fully upright position shown in FIG. 16, the pivot assemblies each feature a dampening means by which the paddle arms, and the anterior neck section therewith, may be positioned at any point along their range of movement from and in between the fully upright and engaged positions. The pivot assemblies both mount to the base section but on opposite sides of the outer housing for the head coil 1000, as best shown in FIGS. 13 and 14.

The base and cover therefor are also illustrated in FIGS. 13 and 14. The base serves as the main mounting structure for the other sections of the neurovascular array. For example, the bottom of C-spine section mounts directly to the base. The bottom or posterior portion of the head coil section is also supported by the base. The base cover provides further support for the C-spine section and the head coil section.

The presently preferred and alternative embodiments for carrying out the invention have been set forth in detail according to the Patent Act. Persons of ordinary skill in the art to which this invention pertains may nevertheless recognize alternative ways of practicing the invention without departing from the spirit of the following claims. Consequently, all changes and variations which fall within the literal meaning, and range of equivalency, of the claims are to be embraced within their scope. Persons of such skill will also recognize that the scope of the invention is indicated by the following claims rather than by any particular example or embodiment discussed or illustrated in the foregoing description.

Accordingly, to promote the progress of science and useful arts, we secure for ourselves by Letters Patent exclusive rights to all subject matter embraced by the following claims for the time prescribed by the Patent Act.

What is claimed is:

1. A head coil for use with a magnetic resonance (MR) system capable of acquiring images of a region of interest using parallel imaging techniques; the head coil comprising:
    (a) a first ring at an inferior end of the head coil, said first ring being electrically conductive and having a first diameter through which the region of interest is provided access to the head coil;
    (b) a second ring at a superior end of the head coil, said second ring being electrically conductive and having a second diameter smaller than said first diameter of said first ring; and
    (c) a plurality of rods electrically interconnecting said first and said second rings to form a birdcage-like structure therewith, each of said rods having a linear portion and a tapered portion with said linear portion being connected to said first ring and said tapered portion being connected to said second ring, said tapered portions of said rods collectively providing the head coil with a substantially homogeneous pattern of magnetic flux density in at least one of three orthogonal imaging planes of the head coil while performing at least one of maintaining and improving a signal-to-noise ratio of the head coil;
    wherein said rods and said first and said second rings are configured to produce about the birdcage-like structure a plurality of partially-overlapped primary resonant substructures, with each of said primary resonant substructures including two of said rods and a corresponding section of each of said first and said second rings interconnecting them such that each of said primary resonant substructures partially overlaps each of its neighboring primary resonant substructures and is capable of receiving magnetic resonance signals from a portion of the region of interest within its field of view.

2. The head coil of claim 1 wherein said plurality of partially-overlapped primary resonant substructures are deployed generally symmetrically about the birdcage-like structure.

3. The head coil of claim 1 wherein said plurality of partially-overlapped primary resonant substructures is three in number, with each being generally deployed 120 degrees apart.

4. The head coil of claim 3 wherein selected ones of said rods are spaced at irregular distances from adjacent ones of said rods.

5. The head coil of claim 1 wherein said plurality of partially-overlapped primary resonant substructures is four in number, with each being generally deployed 90 degrees apart.

6. The head coil of claim 5 wherein selected ones of said rods are spaced at irregular distances from adjacent ones of said rods.

7. The head coil of claim 1 wherein said plurality of partially-overlapped primary resonant substructures is six in number, with each being generally deployed 60 degrees apart.

8. The head coil of claim 7 wherein selected ones of said rods are spaced at irregular distances from adjacent ones of said rods.

9. The head coil of claim 1 wherein selected ones of said rods are spaced at irregular distances from adjacent ones of said rods.

10. The head coil of claim 1 wherein:
    (a) said plurality of rods is eight in number and selected ones of said rods are spaced at irregular distances from adjacent ones of said rods; and
    (b) said plurality of partially-overlapped primary resonant substructures is four in number, with each being generally deployed 90 degrees apart.

11. The head coil of claim 1 wherein the head coil is a receive-only coil.

12. The head coil of claim 1 wherein:
    (a) each of said primary resonant substructures includes an active decoupling network in said corresponding section of said second ring thereof; and
    (b) each of said rods includes a passive decoupling network therein.

13. The head coil of claim 1 wherein each of said rods and said first and said second rings contain therein a plurality of reactive electrical components.

14. The head coil of claim 1 wherein each of said primary resonant substructures includes a port connector in said corresponding section of said second ring thereof for connection to a channel of the MR system.

15. The head coil of claim 1 wherein the head coil is configured as one of a low pass coil, a high pass coil and a band pass coil.

16. The head coil of claim 1 wherein said first and said second rings are circular.

17. The head coil of claim 1 wherein at least one of said first and said second rings are elliptical.

18. The head coil of claim 1 wherein said first ring and said second ring are each larger in diameter than a center of the head coil.

19. A coil for use with a magnetic resonance (MR) system; the coil comprising:
    (a) a first ring at one end of the coil, said first ring being electrically conductive and having a first diameter;
    (b) a second ring at an other end of the coil, said second ring being electrically conductive and having a second diameter; and
    (c) a plurality of rods electrically interconnecting said first and said second rings to form a birdcage-like structure therewith;
    wherein said rods and said first and said second rings are configured to produce a plurality of partially-overlapped primary resonant substructures about the birdcage-like structure, with each of said primary resonant substructures including two of said rods and a corresponding section of each of said first and said second rings interconnecting them such that each of said primary resonant substructures partially overlaps each of its neighboring primary resonant substructures and is capable of receiving magnetic resonance signals from tissue within its field of view.

20. The coil of claim 19 wherein said second diameter of said second ring is smaller than said first diameter of said first ring.

21. The coil of claim 20 wherein each of said rods has a linear portion and a tapered portion with said linear portion being connected to said first ring and said tapered portion being connected to said second ring.

22. The coil of claim 21 wherein said tapered portion of each of said rods comprises at least one angled linear segmented section.

23. The coil of claim 19 wherein said first and said second diameters of said first and said second rings, respectively, are equal.

24. The coil of claim 19 wherein said first and said second rings are circular.

25. The coil of claim 19 wherein at least one of said first and said second rings are elliptical.

26. The coil of claim 19 wherein said plurality of partially-overlapped primary resonant substructures are deployed generally symmetrically about the birdcage-like structure.

27. The coil of claim 19 wherein said plurality of partially-overlapped primary resonant substructures is three in number, with each being generally deployed 120 degrees apart.

28. The coil of claim 27 wherein selected ones of said rods are spaced at irregular distances from adjacent ones of said rods.

29. The coil of claim 19 wherein said plurality of partially-overlapped primary resonant substructures is four in number, with each being generally deployed 90 degrees apart.

30. The coil of claim 29 wherein selected ones of said rods are spaced at irregular distances from adjacent ones of said rods.

31. The coil of claim 19 wherein said plurality of partially-overlapped primary resonant substructures is six in number, with each being generally deployed 60 degrees apart.

32. The coil of claim 31 wherein selected ones of said rods are spaced at irregular distances from adjacent ones of said rods.

33. The coil of claim 19 wherein selected ones of said rods are spaced at irregular distances from adjacent ones of said rods.

34. The coil of claim 19 wherein:
    (a) said plurality of rods is eight in number and selected ones of said rods are spaced at irregular distances from adjacent ones of said rods; and
    (b) said plurality of partially-overlapped primary resonant substructures is four in number, with each being generally deployed 90 degrees apart.

35. The coil of claim 19 wherein the coil is a receive-only coil.

36. The coil of claim 19 wherein:
(a) each of said primary resonant substructures includes an active decoupling network in said corresponding section of said second ring thereof; and
(b) each of said rods includes a passive decoupling network therein.

37. The coil of claim 19 wherein each of said primary resonant substructures includes a port connector in said corresponding section of said second ring thereof for connection to one channel of the MR system.

38. The coil of claim 19 wherein the coil is configured as one of a low pass coil, a high pass coil and a band pass coil.

39. The coil of claim 19 wherein said first ring and said second ring are each larger in diameter than a center of the coil.

40. The coil of claim 19 wherein said first ring and said second ring are each smaller in diameter than a center of the coil.

41. The coil of claim 19 wherein each of said primary resonant substructures has the magnetic resonance signals received thereby conveyed via said separate port therefor to at least one combiner for combination with the magnetic resonance signals received by at least one other of said primary resonant substructures, with the combined MR signals routed to one channel of the MR system during a receive cycle thereof.

42. A coil for use with a magnetic resonance (MR) system; the coil comprising:
(a) a pair of electrically conductive rings, each of said rings being disposed approximately at an opposite end of the coil from the other; and
(b) a plurality of rods electrically interconnecting said rings to form a birdcage-like structure therewith;
wherein said rods and said rings are configured to produce a plurality of partially-overlapped primary resonant substructures about the birdcage-like structure, with each of said primary resonant substructures including two of said rods and a corresponding section of each of said rings interconnecting them such that each of said primary resonant substructures partially overlaps each of its neighboring primary resonant substructures and is capable of receiving magnetic resonance signals from tissue within its field of view.

43. The coil of claim 42 wherein a first of said rings has a first diameter and a second of said rings has a second diameter, with said second diameter being smaller than said first diameter.

44. The coil of claim 43 wherein each of said rods has a linear portion and a tapered portion with said linear portion being connected to said first ring and said tapered portion being connected to said second ring.

45. The coil of claim 44 wherein said tapered portion of each of said rods comprises at least one angled linear segmented section.

46. The coil of claim 42 wherein a first of said rings has a first diameter and a second of said rings has a second diameter, with said second diameter being equal to said first diameter.

47. The coil of claim 42 wherein both of said pair of rings are circular.

48. The coil of claim 42 wherein at least one of said pair of rings is elliptical.

49. The coil of claim 42 wherein said plurality of partially-overlapped primary resonant substructures are deployed generally symmetrically about the birdcage-like structure.

50. The coil of claim 42 wherein said plurality of partially-overlapped primary resonant substructures is three in number, with each being generally deployed 120 degrees apart.

51. The coil of claim 50 wherein selected ones of said rods are spaced at irregular distances from adjacent ones of said rods.

52. The coil of claim 42 wherein said plurality of partially-overlapped primary resonant substructures is four in number, with each being generally deployed 90 degrees apart.

53. The coil of claim 52 wherein selected ones of said rods are spaced at irregular distances from adjacent ones of said rods.

54. The coil of claim 42 wherein said plurality of partially-overlapped primary resonant substructures is six in number, with each being generally deployed 60 degrees apart.

55. The coil of claim 54 wherein selected ones of said rods are spaced at irregular distances from adjacent ones of said rods.

56. The coil of claim 52 wherein selected ones of said rods are spaced at irregular distances from adjacent ones of said rods.

57. The coil of claim 52 wherein:
(a) said plurality of rods is eight in number and selected ones of said rods are spaced at irregular distances from adjacent ones of said rods; and
(b) said plurality of partially-overlapped primary resonant substructures is four in number, with each being generally deployed 90 degrees apart.

58. The coil of claim 42 wherein the coil is a receive-only coil.

59. The coil of claim 42 wherein:
(a) each of said primary resonant substructures includes an active decoupling network in said corresponding section of a second of said pair of rings thereof; and
(b) each of said rods includes a passive decoupling network therein.

60. The coil of claim 42 wherein each of said primary resonant substructures has said separate port therefor in said corresponding section of a second of said pair of rings thereof for connection to one channel of the MR system.

61. The coil of claim 42 wherein the coil is configured as one of a low pass coil, a high pass coil and a band pass coil.

62. The coil of claim 42 wherein said rings are each larger in diameter than a center of the coil.

63. The coil of claim 42 wherein said rings are each smaller in diameter than a center of the coil.

64. The coil of claim 42 wherein each of said primary resonant substructures has the magnetic resonance signals received thereby conveyed via said separate port therefor to at least one combiner for combination with the magnetic resonance signals received by at least one other of said primary resonant substructures, with the combined MR signals routed to one channel of the MR system during a receive cycle thereof.

65. A coil for use with a magnetic resonance (MR) system; the coil comprising:
(a) a first end member approximate one end of the coil, said first end member being electrically conductive;

(b) a second end member approximate an other end of the coil, said second end member being electrically conductive; and (c) a plurality of rods electrically interconnecting said first and said second end members;

wherein said rods and said first and said second end members are configured to yield a plurality of partially-overlapped primary resonant substructures, with each of said primary resonant substructures including two of said rods and a corresponding section of each of said first and said second end members interconnecting them such that each of said primary resonant substructures partially overlaps at least one of its neighboring primary resonant substructures and is capable of receiving magnetic resonance signals from tissue within its field of view.

66. The coil of claim 65 wherein:

(a) said first and said second end members are rings; and (b) said rods and said first and said second end members are interconnected to form a birdcage-like structure with said plurality of partially-overlapped primary resonant substructures deployed thereabout.

67. The coil of claim 65 wherein said rods and said first and said second end members are interconnected to form an open-sided birdcage-like structure with said plurality of partially-overlapped primary resonant substructures deployed thereabout.

68. The coil of claim 65 wherein said rods and said first and said second end members are interconnected to form a surface coil-like structure with said plurality of partially-overlapped primary resonant substructures deployed therealong.

69. The coil of claim 65 wherein the coil is a receive-only coil.

70. The coil of claim 65 wherein:

(a) each of said primary resonant substructures includes an active decoupling network in said corresponding section of one of said end members thereof; and (b) each of said rods includes a passive decoupling network therein.

71. The coil of claim 65 wherein each of said primary resonant substructures includes a port connector in said corresponding section of one of said end members thereof for connection to one channel of the MR system.

72. The coil of claim 65 wherein the coil is configured as one of a low pass coil, a high pass coil and a band pass coil.

73. The coil of claim 65 wherein each of said primary resonant substructures has the magnetic resonance signals received thereby conveyed via a separate port therefor to at least one combiner for combination with the magnetic resonance signals received by at least one other of said primary resonant substructures, with the combined MR signals routed to one channel of the MR system during a receive cycle thereof.

74. A neurovascular array for use with a magnetic resonance (MR) system; the neurovascular array comprising:

(a) a head coil including:

(I) a first ring approximate one end of the head coil, said first ring being electrically conductive and having a first diameter, (II) a second ring approximate an other end of the head coil, said second ring being electrically conductive and having a second diameter, and (III) a plurality of rods electrically interconnecting said first and said second rings to form a birdcage-like structure therewith, wherein said rods and said first and said second rings are configured to produce a plurality of partially-overlapped primary resonant substructures about the birdcage-like structure, with each of said primary resonant substructures constituting a coil element having two of said rods and a corresponding section of each of said first and said second rings interconnecting them such that each of said coil elements partially overlaps each of its neighboring coil elements and is capable of receiving magnetic resonance signals from tissue within its field of view;

(b) an anterior neck coil including at least one coil element; and (c) a posterior cervical spine coil including at least one coil element.

75. The neurovascular array of claim 74 wherein at least one of said coil elements of said anterior neck coil and said posterior cervical spine coil partially overlaps said head coil at an inferior end thereof.

* * * * *

UNITED STATES PATENT AND TRADEMARK OFFICE
CERTIFICATE OF CORRECTION

| | |
|---|---|
| PATENT NO. | : 7,084,629 B2 |
| APPLICATION NO. | : 10/723428 |
| DATED | : August 1, 2006 |
| INVENTOR(S) | : Monski, Jr. et al. |

It is certified that error appears in the above-identified patent and that said Letters Patent is hereby corrected as shown below:

ON THE TITLE PAGE, ITEM (57), under "ABSTRACT", in Column 2, Lines 1-11, delete "A birdcage coil............ rings interconnecting them." and insert -- A coil for use with a magnetic resonance (MR) system includes a pair of electrically conductive rings and a plurality of rods. The rings are disposed at an opposite ends of the coil from one other, and the rods electrically interconnect the rings to form a birdcage-like structure therewith. The rods and rings are configured to produce about the birdcage-like structure a plurality of partially-overlapped primary resonant substructures, with each primary resonant substructure including two rods and a corresponding section of each of the rings interconnecting them. In this configuration, each primary resonant substructure (i) partially overlaps each of its neighboring primary resonant substructures and electrically shares therewith a region of overlap created thereby and (ii) is capable of receiving MR signals from tissue within its field of view thus enabling each primary resonant substructure to convey the MR signals received thereby via a separate port to the MR system. --, therefor.

UNITED STATES PATENT AND TRADEMARK OFFICE
CERTIFICATE OF CORRECTION

PATENT NO. : 7,084,629 B2
APPLICATION NO. : 10/723428
DATED : August 1, 2006
INVENTOR(S) : Monski, Jr. et al.

It is certified that error appears in the above-identified patent and that said Letters Patent is hereby corrected as shown below:

IN THE SPECIFICATION

Columns 6 & 7, Lines 43-67 & 1-2, delete "In a presently preferred embodiment,............. the region of interest." and insert -- In a presently preferred embodiment, the invention provides a head coil for use with a magnetic resonance (MR) system capable of acquiring images of a region of interest using parallel imaging techniques. The head coil includes a first ring at an inferior end of the head coil, a second ring at a superior end of the head coil, and a plurality of rods electrically interconnecting the first and second rings to form a birdcage-like structure therewith. The first ring is electrically conductive and has a first diameter through which the region of interest is provided access to the head coil. The second ring is electrically conductive and has a second diameter smaller than the first diameter of the first ring. Each rod has a linear portion and a tapered portion with the linear portion being connected to the first ring and the tapered portion being connected to the second ring. The tapered portions of the rods collectively provide the head coil with a substantially homogeneous pattern of magnetic flux density in at least one of three orthogonal imaging planes of the head coil while maintaining and/or improving the signal-to-noise ratio of the head coil. The rods and rings of the head coil are configured to produce about the birdcage-like structure a plurality of partially-overlapped primary resonant substructures, with each primary resonant substructure including two rods and a corresponding section of each of the rings interconnecting them. In this configuration, each primary resonant substructure (i) partially overlaps each of its neighboring primary resonant substructures and electrically shares therewith a region of overlap created thereby and (ii) is capable of receiving magnetic resonance signals from a portion of the region of interest within its field of view thus enabling each primary resonant substructure to convey the magnetic resonance signals received thereby via a separate port to the MR system. In a broader aspect, the invention provides a coil for use with a magnetic resonance (MR) system. The coil includes a first ring a one end of the coil, a second ring at the other end of the coil, and a plurality of rods electrically interconnecting the rings to form a birdcage-like structure therewith. The first ring is electrically conductive and has a first diameter, and the second ring is electrically conductive and has a second diameter. The rods and rings of the coil are configured to produce about the birdcage-like structure a plurality of partially-overlapped primary resonant substructures, with each primary resonant substructure including two rods and a corresponding section of each of the rings interconnecting them. In this configuration, each primary resonant substructure (i) partially overlaps each of its neighboring primary resonant substructures and electrically shares therewith a region of overlap created thereby and (ii) is capable of receiving magnetic resonance signals from tissue within its field of view thus enabling each primary resonant substructure to convey the magnetic resonance signals received thereby via a separate port to the MR system. --, therefor.

UNITED STATES PATENT AND TRADEMARK OFFICE
CERTIFICATE OF CORRECTION

| | |
|---|---|
| PATENT NO. | : 7,084,629 B2 |
| APPLICATION NO. | : 10/723428 |
| DATED | : August 1, 2006 |
| INVENTOR(S) | : Monski, Jr. et al. |

Page 3 of 7

It is certified that error appears in the above-identified patent and that said Letters Patent is hereby corrected as shown below:

IN THE SPECIFICATION (Cont'd)

Column 7, Lines 3-20, delete "In a related aspect, invention............. region of interest." and insert -- In an even broader aspect; the invention provides a coil for use with a magnetic resonance (MR) system. The coil includes a pair of electrically conductive rings and a plurality of rods. The rings are disposed approximately at an opposite ends of the coil from one other, and the rods electrically interconnect the rings to form a birdcage-like structure therewith. The rods and rings of the coil are configured to produce about the birdcage-like structure a plurality of partially-overlapped primary resonant substructures, with each primary resonant substructure including two rods and a corresponding section of each of the rings interconnecting them. In this configuration, each primary resonant substructure (i) partially overlaps each of its neighboring primary resonant substructures and electrically shares therewith a region of overlap created thereby and (ii) is capable of receiving magnetic resonance signals from tissue within its field of view thus enabling each primary resonant substructure to convey the magnetic resonance signals received thereby via a separate port to the MR system. --, therefor.

Column 7, Lines 21-37, delete "In a broader aspect,............. the region of interest." and insert -- In another aspect, the invention provides a coil for use with a magnetic resonance (MR) system. The coil includes a first electrically conductive end member, a second electrically conductive end member, and a plurality of rods electrically interconnecting the first and second end members to form a unitary structure therewith. The first end member is disposed approximate one end of the coil, and the second end member is disposed approximate the other end of the coil. The rods and end members are configured to produce about the unitary structure a plurality of partially-overlapped primary resonant substructures, with each primary resonant substructure including two rods and a corresponding section of each of the end members interconnecting them. In this configuration, each primary resonant substructure (i) partially overlaps its neighboring primary resonant substructure(s) and electrically shares therewith a region of overlap created thereby and (ii) is capable of receiving magnetic resonance signals from tissue within its field of view thus enabling each of the primary resonant substructures to convey the magnetic resonance signals received thereby to the MR system. --, therefor.

UNITED STATES PATENT AND TRADEMARK OFFICE
CERTIFICATE OF CORRECTION

PATENT NO. : 7,084,629 B2
APPLICATION NO. : 10/723428
DATED : August 1, 2006
INVENTOR(S) : Monski, Jr. et al.

It is certified that error appears in the above-identified patent and that said Letters Patent is hereby corrected as shown below:

IN THE SPECIFICATION (Cont'd)

Column 7, Lines 38-49, delete "In an even broader aspect, invention............rings interconnecting them." and insert -- In a related aspect, the invention also provides a neurovascular array for use with a magnetic resonance (MR) system. The neurovascular array includes a head coil, an anterior neck coil, and a posterior cervical spine coil. The bead coil includes a first ring approximate one end of the head coil, a second ring approximate the other end of the head coil, and a plurality of rods. The first ring is electrically conductive and has a first diameter, and the second ring is electrically conductive and has a second diameter. The rods electrically interconnect the first and second rings to form a birdcage-like structure therewith. The rods and rings of the head coil are configured to produce about the birdcage-like structure a plurality of partially-overlapped primary resonant substructures, with each primary resonant substructure constituting a coil element having two of the rods and a corresponding section of each of the first and second rings interconnecting them. In this configuration, each coil element of the head coil (i) partially overlaps each of its neighboring coil elements and electrically shares therewith a region of overlap created thereby and (ii) is capable of receiving magnetic resonance signals from tissue within its field of view. The anterior neck coil includes one or more of its own type of coil element as does the posterior cervical spine coil, --, therefor.

Column 9, Line 25, delete "transnPlreceive" and insert -- transmit/receive --, therefor.

Column 10, Line 48, delete "CM," and insert -- $C_m$ , --, therefor.

Column 15, Line 5, delete "CM" and insert -- $C_m$ --, therefor.

Column 15, Line 10, delete "Signa" and insert -- Signa® --, therefor.

Column 16, Line 57, in Claim 1, after "second rings" insert -- of the head coil --.

Column 16, Line 64, in Claim 1, after "substructures" insert -- (i) --.

Column 16, Line 65, in Claim 1, after "substructures and" insert -- electrically shares therewith a region of overlap created thereby and (ii) --.

Column 16, Line 67, n Claim 1, after "field of view" insert -- thus enabling each of said primary resonant substructures to convey the magnetic resonance signals received thereby via a separate port to the MR system --.

Column 18, Line 4, in Claim 19, after "second rings" insert -- of the coil --.

UNITED STATES PATENT AND TRADEMARK OFFICE
CERTIFICATE OF CORRECTION

| | |
|---|---|
| PATENT NO. | : 7,084,629 B2 |
| APPLICATION NO. | : 10/723428 |
| DATED | : August 1, 2006 |
| INVENTOR(S) | : Monski, Jr. et al. |

It is certified that error appears in the above-identified patent and that said Letters Patent is hereby corrected as shown below:

IN THE SPECIFICATION (Cont'd)

Column 18, Line 5, in Claim 19, after "produce" insert -- about the birdcage-like structure --.

Column 18, Lines 6-7, in Claim 19, after "substructures" delete "about the birdcage-like structure".

Column 18, Line 11, in Claim 19, after "substructures" insert -- (i) --.

Column 18, Line 12, in Claim 19, after "substructures and" insert -- electrically shares therewith a region of overlap created thereby and (ii) --.

Column 18, Line 14, in Claim 19, after "field of view" insert -- thus enabling each of said primary resonant substructures to convey the magnetic resonance signals received thereby via a separate port to the MR system --.

Column 19, Line 38, in Claim 42, after "said rings" insert -- of the coil --.

IN THE CLAIMS

Column 16, Line 57, in Claim 1, after "second rings" insert -- of the head coil --.

Column 16, Line 64, in Claim 1, after "substructures" insert -- (i) --.

Column 16, Line 65, in Claim 1, after "substructures and" insert -- electrically shares therewith a region of overlap created thereby and (ii) --.

Column 16, Line 67, in Claim 1, after "field of view" insert -- thus enabling each of said primary resonant substructures to convey the magnetic resonance signals received thereby via a separate port to the MR system --.

Column 18, Line 4, in Claim 19, after "second rings" insert -- of the coil --.

Column 18, Line 5, in Claim 19, after "produce" insert -- about the birdcage-like structure --.

Column 18, Lines 6-7, in Claim 19, after "substructures" delete "about the birdcage-like structure".

Column 18, Line 11, in Claim 19, after "substructures" insert -- (i) --.

UNITED STATES PATENT AND TRADEMARK OFFICE
CERTIFICATE OF CORRECTION

PATENT NO.       : 7,084,629 B2
APPLICATION NO.  : 10/723428
DATED            : August 1, 2006
INVENTOR(S)      : Monski, Jr. et al.

It is certified that error appears in the above-identified patent and that said Letters Patent is hereby corrected as shown below:

IN THE CLAIMS

Column 18, Line 12, in Claim 19, after "substructures and" insert -- electrically shares therewith a region of overlap created thereby and (ii) --.

Column 18, Line 14, in Claim 19, after "field of view" insert -- thus enabling each of said primary resonant substructures to convey the magnetic resonance signals received thereby via a separate port to the MR system --.

Column 19, Line 38, in Claim 42, after "said rings" insert -- of the coil --.

Column 19, Line 38, in Claim 42, after "produce" insert -- about the birdcage-like structure --.

Column 19, Line 40, in Claim 42, after "substructures" delete "about the birdcage-like structure".

Column 19, Line 44, in Claim 42, after "substructures" insert -- (i) --.

Column 19, Line 45, in Claim 42, after "substructures and" insert -- electrically shares therewith a region of overlap created thereby and (ii) --.

Column 19, Line 47, in Claim 42, after "field of view" insert -- thus enabling each of said primary resonant substructures to convey the magnetic resonance signals received thereby via a separate port to the MR system --.

Column 20, Line 27, in Claim 56, delete "52" and insert -- 42 --, therefor.

Column 20, Line 30, in Claim 57, delete "52" and insert -- 42 --, therefor.

Column 21, Line 5, in Claim 65, after "end members" insert -- to form a unitary structure therewith --.

Column 21, Line 7, in Claim 65, after "to yield" insert -- about the unitary structure --.

Column 21, Line 13, in Claim 65, insert -- (i) --, before "partially".

Column 21, Line 13, in Claim 65, after "overlaps" delete "at least one of".

Column 21, Line 14, in Claim 65, delete "substructures and" and insert -- substructure (s) and electrically shares therewith a region of overlap created thereby and (ii) --, therefor.

UNITED STATES PATENT AND TRADEMARK OFFICE
CERTIFICATE OF CORRECTION

PATENT NO.        : 7,084,629 B2
APPLICATION NO.   : 10/723428
DATED             : August 1, 2006
INVENTOR(S)       : Monski, Jr. et al.

It is certified that error appears in the above-identified patent and that said Letters Patent is hereby corrected as shown below:

IN THE CLAIMS (cont'd)

Column 21, Line 16, in Claim 65, after "field of view" insert -- thus enabling each of said primary resonant substructures to convey the magnetic resonance signals received thereby to the MR system --.

Column 22, Line 24, in Claim 74, after "second rings" insert -- of the head coil --.

Column 22, Line 25, in Claim 74, after "produce" insert -- about the birdcage-like structure --.

Column 22, Lines 26-27, in Claim 74, after "substructures" delete "about the birdcage-like structure".

Column 22, Line 31, in Claim 74, after "elements" insert -- (i) --.

Column 22, Line 32, in Claim 74, after "coil elements and" insert -- electrically shares therewith a region of overlap created thereby and (ii) --.

Signed and Sealed this

Twenty-seventh Day of November, 2007

JON W. DUDAS
*Director of the United States Patent and Trademark Office*